(12) United States Patent
Denoth et al.

(10) Patent No.: US 9,658,303 B2
(45) Date of Patent: May 23, 2017

(54) GRADIENT COIL WITH CORRECTION WINDINGS AND METHOD FOR PRODUCTION THEREOF

(71) Applicant: Bruker BioSpin AG, Faellanden (CH)

(72) Inventors: Schimun Denoth, Zurich (CH); Silvia Buttazzoni, Zollikofen (CH); Thomas Speck, Thalwil (CH); Dirk Wilhelm, Maur (CH)

(73) Assignee: Bruker BioSpin AG, Faellanden (CH)

( * ) Notice: Subject to any disclaimer, the term of this patent is extended or adjusted under 35 U.S.C. 154(b) by 1112 days.

(21) Appl. No.: 13/771,107

(22) Filed: Feb. 20, 2013

(65) Prior Publication Data
US 2013/0229182 A1   Sep. 5, 2013

(30) Foreign Application Priority Data
Mar. 2, 2012  (DE) .......................... 10 2012 203 343

(51) Int. Cl.
*G01R 33/385*   (2006.01)
*G01R 33/421*   (2006.01)
*G01R 33/565*   (2006.01)

(52) U.S. Cl.
CPC ....... *G01R 33/385* (2013.01); *G01R 33/4215* (2013.01); *G01R 33/56518* (2013.01); *G01R 33/3858* (2013.01); *Y10T 29/49004* (2015.01)

(58) Field of Classification Search
CPC .............. G01R 33/385; G01R 33/3858; G01R 33/4215; G01R 33/56518; G01R 33/3875; G01R 33/387; Y10T 29/49004
USPC ............. 324/318–320, 322; 335/299; 29/593
See application file for complete search history.

(56) References Cited

U.S. PATENT DOCUMENTS

| | | |
|---|---|---|
| 4,737,716 A | 4/1988 | Roemer |
| 4,896,129 A | 1/1990 | Turner |
| 4,978,920 A | 12/1990 | Mansfield |
| 5,742,164 A | 4/1998 | Roemer |
| 5,793,209 A * | 8/1998 | Kondo ................. G01R 33/385 324/318 |
| 6,456,076 B1 | 9/2002 | Joseph |
| 7,069,195 B2 | 6/2006 | Hasegawa |
| 7,230,426 B2 | 6/2007 | Evans |
| 2004/0183535 A1 | 9/2004 | Heid |
| 2012/0074942 A1* | 3/2012 | Hollis ................. G01R 33/385 324/318 |
| 2012/0317795 A1* | 12/2012 | Fath ................... G01R 33/3858 29/605 |

OTHER PUBLICATIONS

R. Turner, "A target field approach to optimal coil design" J. Phys. D: Appl. Phys., vol. 19, (1986).

(Continued)

*Primary Examiner* — Melissa Koval
*Assistant Examiner* — Rishi Patel
(74) *Attorney, Agent, or Firm* — Paul Vincent

(57) ABSTRACT

In a coil arrangement for nuclear magnetic resonance comprising a main coil (13), a shielding coil (14), and at least one correction coil (41), the function of which consists in forming a magnetic field gradient with eddy current properties which are as good as possible, the main coil (13) and the shielding coil (14) are electrically connected in series with the correction coil (41). The deviations of the residual field from the desired design generated by production tolerances are thereby modified by the correction coil in such a fashion that the long-lasting eddy currents are suppressed. This either reduces the waiting time that must lapse after a gradient pulse before a predetermined field homogeneity is achieved or e.g. the deviations from the desired field are minimized in imaging applications.

17 Claims, 12 Drawing Sheets

(56) References Cited

OTHER PUBLICATIONS

C.B. Ahn, Z.H. Cho, "Analysis of the eddy current induced artifacts and the temporal compensation in nuclear magnetic resonance", IEEE Transactions on Medical Imaging vol. 10, Nr. 1, (1991).
R. Turner, "Gradient coil design: a review of methods", Magnetic Resonance Imaging vol. 11, (1993).
T. Parella, "Pulsed field Gradients: a new tool for routine NMR", Magnetic Resonance in Chemistry 36 (1998).
B. Antalek, "Using pulsed field gradient spin echo NMR for chemical mixture analysis: how to obtain optimum results", imaging material and media research and development, Eastman Kodak Company, Rochester, (2002).
R.A. Lemdiasov, R. Ludwig, "A stream function method for gradient coil design", Concepts in Magnetic Resonance Part B 26B(1), (2005).
H. Sanchez Lopez, M. Poole, S. Crozier, "Eddy current simulation in thick cylinders of finite length induced by coils of arbitrary geometry", Journal of Magnetic Resonance 207, (2010).
J. Jin, "Electromagnetic analysis and design in magnetic resonance imaging", CRC Press, (1999).
J. Cavanagh, W.J. Fairbrother, A.G. Palmer, III, M. Rance, N. J. Skelton, "Protein NMR spectroscopy—principles and practice", Elsevier, Second Edition, (2007).

\* cited by examiner

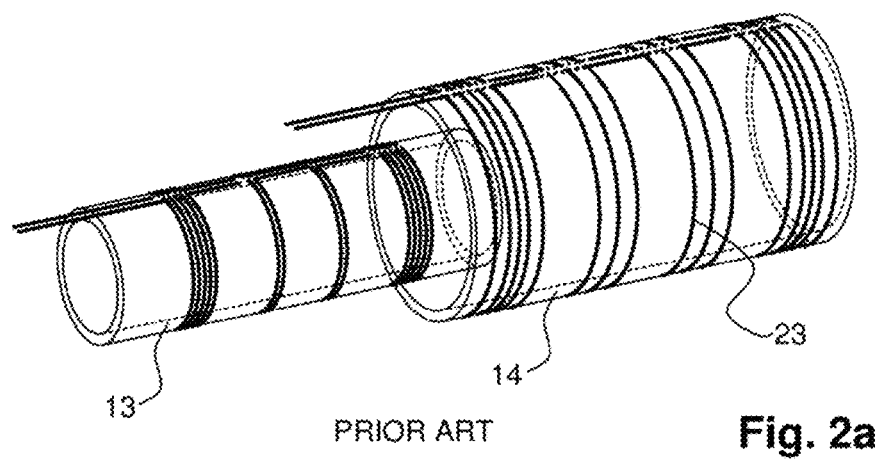
PRIOR ART  Fig. 2a
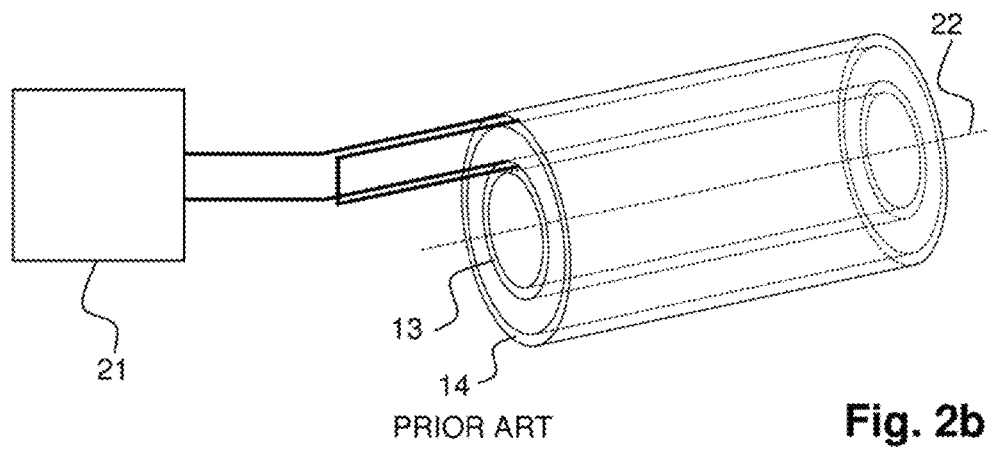
PRIOR ART  Fig. 2b

GRADIENT COIL WITH CORRECTION WINDINGS AND METHOD FOR PRODUCTION THEREOF

This application claims Paris convention priority of DE 10 2012 203 343.2 filed Mar. 2, 2012, the entire disclosure of which is hereby incorporated by reference.

BACKGROUND OF THE INVENTION

The invention concerns an actively shielded gradient coil system for use in a magnetic resonance device, comprising a main field magnet which generates a main magnetic field that is oriented in the direction of a z-axis, wherein, when a current flows, the gradient coil system generates a gradient field in a measuring volume through which the z-axis extends, wherein the gradient coil system comprises a main coil, a shielding coil and at least one correction coil, wherein the active conductor elements of the main coil and of the shielding coil, which contribute to the gradient field when a current flows, each take up spatial areas in a plane perpendicular to the z-axis, wherein the partial area taken up by the main coil extends in a radial direction with respect to the z-axis from $r\_min\_1(z)$ to $r\_max\_1(z)$ (with $r\_min\_1(z)$ $r\_max\_1(z)$), wherein the partial area taken up by the shielding coil extends in a radial direction with respect to the z-axis from $r\_min\_2(z)$ to $r\_max\_2(z)$ (with $r\_max\_1(z)$ $r\_min\_2(z)$ $r\_max\_2(z)$), wherein the mentioned radial partial areas are occupied by active conductor elements in more than half of the azimuthal angle range with respect to the z-axis, and wherein the active conductor elements of the correction coil are arranged in planes perpendicular to the z-axis in each case outside of the radial partial area of the main coil and outside of the radial partial areas of the shielding coil.

A gradient coil system of this type is disclosed e.g. in U.S. Pat. No. 5,742,164 (document [7]).

FIG. 3 shows in principle the prior art described in [7].

Further radial partial areas $r\_min\_n(z)$ to $r\_max\_n(z)$ may also be taken up by the shielding coil, wherein $r\_max\_(n-1)(z) \leq r\_min\_n(z) \leq r\_max\_n(z)$ and $n>2$ is a natural number, which, however, is not disclosed in [7]. Shielding coils which take up further radial partial areas are familiar to the expert as is illustrated e.g. in FIG. 1 in [11].

HISTORY OF THE INVENTION

NMR spectroscopy and also magnetic resonance imaging (MRI) or diffusion measurements using magnetic resonance are nowadays performed using field gradient NMR (pulsed field gradient NMR or PFG-NMR). The gradient coil system generates locally inhomogeneous (typically linear in one or more axes) transient magnetic fields in a certain measuring volume (11). The amplitude and the duration of the linear magnetic fields are controlled in the experiment. The advantages of the field gradient NMR and the reasons why it enables performance of very complex NMR experiments is disclosed in NMR literature [8], [16].

The current in the gradient coil system is switched on within a very short time (on the order of magnitude of a few dozen microseconds) and is switched off again after a certain duration (typically after a few milliseconds). During switching on and off, eddy currents are excited in the nearby conducting structures. These, for their part, form a time-dependent magnetic field in the measuring volume, which adds to the time-constant magnetic field (main magnetic field). The NMR signal is thereby influenced and may even be completely eliminated under certain circumstances. Recovery of an NMR signal may sometimes take a long time, which can represent a great obstacle for complex NMR experiments. The gradient is often used several times within complex pulse sequences and each time after switching off, a certain waiting time is scheduled before a radio frequency (RF) pulse follows. This waiting time is disadvantageous for the experiment since the magnetization decreases through relaxation processes. For larger molecules, such as e.g. proteins, the relaxation times are short and for this reason waiting times have a particularly disadvantageous effect.

FIG. 10 shows an example of a complex pulse sequence that is used for the investigation and structure analysis of proteins [16]. In this NMR experiment, RF pulses are applied at the resonance frequencies of $^1H$, $^2H$, $^{13}C$ and $^{15}N$ atomic nuclei in a close temporal succession with gradient pulses. This pulse sequence, in which a gradient pulse is switched sixteen times between the first excitation pulse for $^{15}N$ and the start of acquisition, illustrates how the waiting time after each gradient pulse can affect the overall duration of the experiment. Conversely, the quality of the results of such an experiment may strongly suffer from the artefacts which are generated by eddy currents induced by gradients in case these waiting times are not sufficiently long.

One further field of application, in which eddy currents induced by gradients must be avoided, concerns experiments which use field gradient spin echoes for determining diffusion constants. Reference [10] extensively reports on the negative effects of a distorted signal in field gradient spin echo NMR experiments (Pulsed Gradient Spin Echo or PGSE) due to eddy currents induced by gradients. This powerful method performs a mixture analysis of chemical substances based on diffusion coefficients. A precise determination of the diffusion coefficients is only possible when the artefacts in the NMR spectra are low. The distortions of the signal, which are generated by eddy currents, are one of the greatest obstacles of this method.

Optimization with respect to gradient-induced eddy currents is therefore an important task in the production of gradient coil systems.

It is the underlying purpose of the present invention to supplement the coil arrangement of the gradient coil system with a correction coil such that the disturbance by eddy currents is reduced in time and also greatly reduced in amplitude.

Calculation of Gradients

At the end of the 80-ies a few powerful methods were invented for calculating gradient coils such as the Target Field Method [1] [4] [15] or the Stream Function Method [2] [11].

The discussion in the following paragraphs is based on the Target Field Method formalism. This formalism is particularly suitable when the surroundings consist of thin layers having a cylindrical geometry.

In accordance with the Target Field Method, the magnetic fields are generated by current densities which flow on a surface. Preferred and simplified geometries are selected such as e.g. a cylinder tube. The current densities are selected such that they generate a desired magnetic field $B_z$ in the target cylinder. The z-axis is parallel to the main magnetic field. The desired fields typically have the form:

$$B_z(x,y,z) = G_x x \text{ for } x \text{ gradients}$$

$$B_z(x,y,z) = G_y y \text{ for } y \text{ gradients}$$

$$B_z(x,y,z) = G_z z \text{ for } z \text{ gradients}$$

wherein $G_x$, $G_y$, $G_z$ are constants (gradient strength).

Surface current densities on the cylinder surface having a radius a are considered below. Due to the selected geometry, they are written in cylinder coordinates (ρ,φ,z). They have the form $$\vec{j}^a(\rho,\phi,z) = \delta(\rho-a) \cdot [j_\phi^a(a,\phi,z) \cdot \vec{e}_\phi + j_z^a(a,\phi,z) \cdot \vec{e}_z]. \quad 1$$

The vectors $\vec{e}_\phi$ and $\vec{e}_z$ are the unit vectors in cylinder coordinates.

The Target Field method utilizes the Fourier transform of the current density for the calculations of the magnetic fields. The Fourier transforms of the current density are calculated as follows $$\hat{j}_\phi^a(m,k) = \frac{1}{2\pi} \int_{-\pi}^{+\pi} d\phi \cdot e^{-im\phi} \int_{-\infty}^{+\infty} e^{-ikz} j_\phi^a(\rho,\phi,z) \cdot dz \quad 2$$

$$\hat{j}_z^a(m,k) = \frac{1}{2\pi} \int_{-\pi}^{+\pi} d\phi \cdot e^{-im\phi} \int_{-\infty}^{+\infty} e^{-ikz} j_z^a(\rho,\phi,z) \cdot dz. \quad 3$$

The values m and k are azimuthal (m) and axial (k) wave numbers. Since the current densities $j_\phi^a(\rho,\phi,z)$ and $j_z^a(\rho,\phi,z)$ are linked by the following continuity equations $$\nabla \cdot \vec{j}^a = \frac{\partial j_\phi^a}{a\partial\phi} + \frac{\partial j_z^a}{\partial z} = 0 \quad 4$$

the following applies in the Fourier space $$m \cdot \hat{j}_\phi^a(m,k) + k \cdot a \cdot \hat{j}_z^a(m,k) = 0. \quad 5$$

It is therefore sufficient to know the φ component of the current density at the radius a. The z component is then also determined.

Calculation of Shielded Gradient Coils

The problem of eddy currents induced by gradients has always been a major issue in high-resolution NMR spectroscopy. The negative effects of the eddy currents on the quality of the spectra have greatly limited the application of field gradient NMR for a long time. Only with the introduction of actively shielded gradient coils, has it been possible to benefit from the enormous advantages of field gradient NMR. The Stream Function or Target Field Method allows, in principle, calculation of completely shielded gradient coils.

The Target Field Method permits design of an inner (with radius a) and an outer (with radius b) cylindrical coil arrangement, which is coaxial with respect to the z-axis, in such a fashion that the combination simultaneously meets the following conditions:

A desired field is generated in the measuring volume.
The field is eliminated in the surroundings outside of the gradient coils (on cylinder surfaces having a radius larger than b).

The fields in the surroundings outside of the gradient coils are called residual fields. In accordance with the Target Field Method, these fields are also calculated on a cylinder tube. The radius of the tube is designated by c below, wherein c>b.

Towards this end, the current densities $j_\phi^a(\rho,\phi,z)$ and $j_z^a(\rho,\phi,z)$, which flow on the cylindrical tube with radius a (main coil) and the current densities $j_\phi^b(\rho,\phi,z)$ and $j_z^b(\rho,\phi,z)$, which flow on the radius b (shielding coil) and also have the form as in equation 1, are simultaneously determined. There is an exact solution for the case in which the cylinders are infinitely long and the current density assumes continuous values.

Based on this arrangement of current densities on two radii, which can be easily mathematically described, it is possible to develop arrangements of shielded gradient coils, in which the current densities are distributed to several radial areas. Radial areas are defined in each plane perpendicular to the z-axis. The radial areas are characterized by a minimum radius r_min_n(z) and a maximum radius r_max_n(z), between which the conductor elements are located. The radial areas are numbered from the inside to the outside by numbers n=1, 2, . . . .

The radii are measured from the z-axis. r_min_n(z) and r_max_n(z) are functions of z, i.e. the position and extension of the radial areas may vary in dependence on the z position. For each z position, the following applies: r_min_n(z) r_max_n(z). In certain sections of z, the area spanned by the coils may be empty. The following applies there: r_min_n(z)=r_max_n(z). In particular, for wound coils, large local current densities are approximated from the ideal solution by coil blocks having several layers of windings and therefore a relatively large radial extension.

One structure, in which conductors are positioned on different coil carriers and the coil parts generated in this fashion are subsequently electrically connected, also produces an arrangement that occupies several radial areas.

In the following, the conductors which are disposed radially close to the measuring volume and provide the main contribution to the gradient field are also referred to as the "main coil" and the conductors located in the radially outer areas are also referred to as the "shielding coil" in a gradient coil system in which the position of the conductors is not limited to the two radii a and b.

The area taken up by the main coil is therefore characterized by an area, which is radial with respect to the z-axis, of r_min_1(z) to r_max_1(z) (with r_min_1(z)≤r_max_1(z)). The area taken up by the shielding coil is characterized by at least one area, which is radial with respect to the z-axis, of r_min_2(z) to r_max_2(z) (with r_max_1(z)≤r_min_2(z)≤r_max_2(z)). Further radial areas r_min_n(z) to r_max_n(z) can be taken up by the shielding coil, wherein r_max_(n−1)(z)≤r_min_n(z)≤r_max_n(z) and n>2 is a natural number. The spatial arrangement of these radial areas is illustrated in FIG. 11.

In the design of gradient coil systems, it must be taken into consideration that all conductors must be connected to a current source. The connections required for this purpose must partly also extend in areas where actually no current should flow. There are two solutions for this problem. When currents that flow in opposite directions are carried in spatially close conductors, their effect on the magnetic field is largely cancelled. Currents that flow parallel to the main magnetic field moreover have no influence on the z component of the magnetic field. These two types of ineffective conductors can be installed everywhere. All other conductor elements are called "active conductor elements" below.

The calculated current densities must be realized in practice through discrete conductor paths. The deviation from the continuous solution and the available space that is limited in the z direction (the gradient coil systems cannot have an infinite length) result in that the residual fields do not vanish entirely and eddy currents are generated that produce a magnetic field $\vec{B}^{Wirb}$ in the measuring volume.

Eddy currents are induced in extended electrically conducting structures located in a time-variant magnetic field, wherein the eddy currents themselves generate a magnetic field that counteracts the field change. Let $\vec{j}^{Grad}(\rho, \phi, z, t)$ be the current density of a gradient coil system. Since it is switched on and off, the current density is dependent upon time. In order to present the notation more clearly, the position variables $(\rho, \phi, z)$ are replaced by $\vec{x}$. The time-dependent current density $\vec{j}^{Grad}(\vec{x}, t)$ in virtually static approximation generates the vector potential on the cylinder tube with radius c, which is calculated as follows:

$$\vec{A}^{Grad,c}(\vec{x}, t) = \frac{\mu_0}{4\pi} \int_{R^3} \frac{\vec{j}^{Grad}(\vec{y}, t)}{|\vec{x} - \vec{y}|} \cdot d^3 y \qquad 6$$

$R^3$ is the integration volume and $\mu_0 = 4\cdot\pi\times10^{-7}$ H/m is the vacuum permeability.

Assuming that the time dependence can be described by the dimensionless function h(t) and there is no charge density, the vector potential has the following form $$\vec{A}^{Grad,c}(\vec{x}, t) = h(t)\cdot\vec{A}^{Grad,c}(\vec{x}) \qquad 7$$

and the electric field $$\vec{E}^{Grad,c}(\vec{x}, t) = -h'(t)\cdot\vec{A}^{Grad,c}(\vec{x}), \qquad 8$$

wherein h'(t) is the derivative of h with respect to time. Eddy currents start to flow in the conducting structures surrounding the gradient coil system and having conductivity $\sigma(\vec{x})$ after switching the current in accordance with Ohm's law:

$$\vec{j}^{c,Wirb}(\vec{x}, t) = \sigma(\vec{x})\cdot\vec{E}^{Grad,c}(\vec{x}, t) =$$
$$-\sigma(\vec{x})\cdot h'(t)\cdot\vec{A}^{Grad,c}(\vec{x}). \qquad 9$$

The induced current density $\vec{j}^{c,Wirb}(\vec{x}, t)$ on the cylinder tube with radius c generates the time-dependent magnetic field $\vec{B}^{Wirb}(\vec{x}, t)$ in the measuring volume.

Eddy Currents and Decay Times

Different conducting structures surround the gradient coil system, among them mainly the components of the super-conducting magnet. The surroundings may be represented by several coaxial conducting layers, some of which have very low temperatures (78K or 4K) and therefore high electric conductivities. Since the currents decrease with time like $$\vec{j}(t) = \vec{j}(t=0)\cdot e^{-\left(\frac{t}{\tau}\right)}$$

and the decay time depends on the inductance L and on the resistance R according to $$\tau = \frac{L}{R},$$

the high conductivity of these structures results in long-lasting eddy currents.

Reference [14] describes a model for calculating eddy currents in a realistic cryostat. The cryostat is illustrated by several thick cylinders and characterized by high conductivities. The induced currents are calculated on each individual layer in the Fourier space in that only inductive couplings between the modes are taken into consideration.

The connection between the spatial structure of the eddy currents and their decay times, which is important in the following, is clearly shown by means of a simple model of a thin cylinder. The decay times of the eddy current modes on a thin cylinder with radius c as a function of m and k can be derived using the following argumentation.

The current density $\vec{j}^{c,Wirb}(\vec{x}, t)$ can be decomposed into components of a Fourier expansion (i.e. as a function of m and k). The decay time $\tau$ of an eddy current mode is generally given by the relationship between inductance L and resistance R of the current distribution. The dissipated power P, which depends on the resistance R and the current I, in accordance with $P = R\cdot I^2$, can be written as follows (see equation 33 in [6]).

$$P = \frac{\tilde{\rho}\cdot c}{D}\int_{-\infty}^{+\infty}\sum_{m=-\infty}^{m=+\infty}\left|\hat{j}_\phi^{c,Wirb}(k,m)\right|^2\left(1+\frac{m^2}{k^2 c^2}\right)\cdot dk \qquad 10$$

wherein $\hat{j}_\phi^{c,Wirb}(k,m)$ is the Fourier transform of the current density on the cylinder tube with radius c. The contribution of the z component to P is already taken into consideration by considering equation 5.

The term $\tilde{\rho}$ is the specific resistance of the conducting cylinder and D is its wall thickness. For given m and k the contribution to the dissipated power per current squared is $$\frac{P}{I^2} = \frac{\tilde{\rho}\cdot c}{D}\left(1 + \frac{m^2}{k^2\cdot c^2}\right). \qquad 11$$

In correspondence with equation 34 in [6], the energy $$E = \frac{L}{2}I^2$$

stored in the magnetic field is $$E = -\frac{\mu_0 c^2}{2}\int_{-\infty}^{+\infty}\sum_{m=-\infty}^{m=+\infty}\left|\hat{j}_\phi^{c,Wirb}(k,m)\right|^2 I'_m(|k|\cdot c)K'_m(|k|\cdot c)\cdot dk. \qquad 12$$

$I_m$ are thereby the modified Bessel functions of the first kind, $K_m$ the modified Bessel functions of the second kind and $I'_m$, $K'_m$ their first derivatives.

For given m and k the contribution to the field energy per current squared is $$\frac{E}{I^2} = -\frac{\mu_0\cdot c^2}{2}\cdot I'_m(|k|\cdot c)\cdot K'_m(|k|\cdot c). \qquad 13$$

A combination of equations 11 and 13 gives the decay time $$\tau = \frac{L}{R} = \frac{2\cdot E}{P} = \frac{\mu_0\cdot c\cdot D}{\tilde{\rho}}\cdot M(m, k, c), \qquad 14$$

wherein $$M(m, k, c) = I'_m(|k| \cdot c) \cdot K'_m(|k| \cdot c) \cdot \left(1 + \frac{m^2}{k^2 \cdot c^2}\right)^{-1}. \quad 15$$

The case for m=0 and k→0 is special. The decay time is then $$\tau_0 = \frac{\mu_0 \cdot c \cdot D}{2 \cdot \tilde{\rho}}. \quad 16$$

FIG. 5 shows the decay times normalized to $\tau_0$ as a function of $|k| \cdot c$ for different values of m. The curve (50) corresponds to the value m=0, the curve (51) corresponds to the value m=1 and so on. The decay time decreases both with larger m and also with larger k. For $|k| \cdot c$ going towards infinity, the term 15 tends to zero irrespective of the value of m. For small values of $|k| \cdot c$ and especially for $|k| \cdot c=0$ and m>0, the dependence on m is given by $$M(m > 0, |k| \cdot c = 0) = -\frac{1}{2m}.$$

Effect of the Eddy Currents on the NMR Signal

The following is a brief description of the negative effects of the eddy currents on the NMR signal.

In accordance with the Larmor theorem, the movement of the magnetization vector $\vec{M}$ of an atomic nucleus in a static magnetic field $\vec{B}$ corresponds to a precession about the $\vec{B}$ axis with the Larmor frequency $\vec{\omega} = -\gamma \cdot \vec{B}$. The coefficient $\gamma$ is called gyromagnetic ratio and is an isotope-specific constant. The following applies e.g. for 1H nuclei $\gamma = 2.675 \times 10^8$ $T^{-1}s^{-1}$.

Let $M_z$ be the equilibrium magnetization in the measuring volume. $M_z$ is oriented parallel to the main magnetic field $\vec{B}_0$ in the z direction.

Assuming that the magnetization $M_z$ is rotated with an ideal 90° RF pulse and neglecting off-resonance effects, the magnetization is perpendicular (transverse) to $\vec{B}_0$ after the RF pulse and is designated by $M_+ = M_x + iM_y$.

Immediately after switching off the RF pulse, the transverse magnetization $M_+$ returns to the equilibrium state according to the Bloch equation $$\frac{\partial M_+(\vec{x}, t)}{\partial t} = \left(i\omega(\vec{x}, t) - \frac{1}{T_2}\right) \cdot M_+(\vec{x}, t). \quad 17$$

The Larmor frequency $\omega$ is in the z direction. The constant $T_2$ is the transverse relaxation time and $\vec{x}$ is the position of the atomic nucleus in the measuring volume. In the following, the magnetic fields and the corresponding Larmor frequencies extend in z direction and are therefore considered to be constants.

The Larmor frequency depends on the effective magnetic field $B^{\text{eff}}(\vec{x},t)$ in the measuring volume and the effective field is the sum of the time-constant main magnetic field $B_0(\vec{x})$ and the magnetic field $B^{\text{Wirb}}(\vec{x},t)$, which is generated by the induced eddy currents, such that the following applies $B^{\text{eff}}(\vec{x},t) = B_0(\vec{x}) + B^{\text{Wirb}}(\vec{x},t)$. The effective Larmor frequency $\omega^{\text{eff}}(\vec{x},t)$ is correspondingly also the sum of a time-constant term $\omega_0(\vec{x})$ and of the term $\omega^{\text{Wirb}}(\vec{x},t)$, originating from the induced eddy current such that the following applies: $\omega^{\text{eff}}(\vec{x},t) = \omega_0(\vec{x}) + \omega_{\text{Wirb}}(\vec{x},t)$.

$\omega_0(\vec{x}) = 0$ applies in a rotating system, which is particularly preferred in the NMR environment since it greatly facilitates the calculations, for this reason $\omega^{\text{eff}}(\vec{x},t) = \omega^{\text{Wirb}}(\vec{x},t)$ applies. The solution of the differential equation 17 in the rotating system is $$M_+(\vec{x}, t) = M_+(\vec{x}, t=0) \cdot e^{i\Phi(\vec{x},t) - \frac{t}{T_2}}. \quad 18$$

The phase $\Phi(\vec{x},t)$ in the exponent is the time integral $$\Phi(\vec{x}, t) = \int_0^t \omega^{\text{Wirb}}(\vec{x}, t') \cdot dt'$$

and can be replaced by the time-independent phase $\overline{\Phi}(\vec{x})$, wherein $$\overline{\Phi}(\vec{x}) = \Phi(\vec{x}, t=\infty) = \int_0^\infty \omega^{\text{Wirb}}(\vec{x}, t') \cdot dt',$$

in case the relaxation time of $\omega^{\text{Wirb}}(\vec{x},t)$ is several times smaller than $T_2$. It is preconditioned that no RF pulses are transmitted during the time in which $\omega^{\text{Wirb}}(\vec{x},t)$ is active. The term $M_+(\vec{x},t=0)$ is the initial magnetization. Assuming that the main magnetic field $B_0(\vec{x})$ is homogeneous over the overall measuring volume not only with respect to time but also with respect to space, and that the magnetization in the overall measuring volume is rotated by exactly 90°, the initial magnetization can be replaced by the constant term $\tilde{M} = M_+(\vec{x},t=0)$. The NMR signal is then the integral in the measuring volume V $$S(t) = \frac{1}{V} \int_V M_+(\vec{x}, t) \cdot d^3x = \tilde{c} \cdot \tilde{M} \cdot e^{\frac{t}{T_2}}, \quad 19$$

wherein the definition $$\tilde{c} = \frac{1}{V} \int_V e^{i\overline{\Phi}(\vec{x})} d^3x \quad 20$$

was used.

NMR spectroscopy works with the Fourier-transformed signal $$\hat{S}(\omega) = \int_0^{+\infty} S(t) \cdot e^{-i\omega t} \, dt = \frac{\tilde{c} \cdot \tilde{M}}{+i\omega + \frac{1}{T_2}}. \quad 21$$

FIGS. 6 and 7 show examples of an undisturbed and a disturbed NMR signal. The real part of $\hat{S}(\omega)$ is plotted as a function of the frequency $$v = \frac{\omega}{2\pi}.$$

In case of an undisturbed NMR signal $B_z^{Wirb}(\vec{x},t)=0$, for this reason, the phase $\Phi(\vec{x},t)$ is also always zero ($\Phi(\vec{x},t)=0$). The integral 20 is in this case $\tilde{c}=1$. The disturbances of the NMR signals in this example are caused by a magnetic field $B^{Wirb}$ having the following form $$B^{Wirb}(z,t) = (b_0 + b_1 z) \cdot e^{\frac{t}{\tau}}. \quad 22$$

Let the z area be $-z_0 \leq z \leq z_0$ and the decay time $\tau$ characterized in that it can be neglected compared with $T_2$ ($\tau \ll T_2$). The integral $\tilde{c}$ becomes $$\tilde{c} = \frac{1}{V}\int_V e^{i\Phi(\vec{x})} \cdot d^3 x = \frac{1}{2z_0}\int_{-z_0}^{+z_0} e^{i\gamma\tau(b_0+b_1 z)} dz = e^{i\gamma b_0 \tau}\operatorname{sinc}(\gamma \cdot b_1 \cdot \tau \cdot z_0). \quad 23$$

The curve (60) in FIG. 6 is the undisturbed signal $\hat{S}(v)$ as a function of v. The curves (61) and (62) are the disturbed signals, calculated by equations 21 and 23. Different values of $b_0$ with negligible $b_1$ ($b_1 = 1 \cdot 10^{-15}$ T/m) were observed. For curve (61) $b_0 = 1 \cdot 10^{-7}$ T, whereas for (62) $b_0 = 3 \cdot 10^{-7}$ T.

In FIG. 7, the disturbed signals were calculated with $b_0 = 0$ and for different values of $b_1$. The following was assumed for curve (71) $b_1 = 5 \cdot 10^{-7}$ T/m and for (72) $b_1 = 7 \cdot 10^{-7}$ T/m. In this example, $\tau = 10^{-4}$ s, $T_2 = 2$ s, $z_0 = 0.01$ m and $\tilde{M}=1$ were selected and the gyromagnetic ratio was assumed to be that of the 1H nucleus. The values of $b_0$ and $b_1$ are smaller by several orders of magnitude than those obtaining a typical gradient field in the measuring volume. These fields are of an order of magnitude of $50 \cdot 10^{-4}$ T.

The phase $\Phi(z) = \gamma \cdot \tau \cdot (b_0 + b_1 \cdot z)$ is generated by eddy currents, the contributions of which are characterized by the symmetry m=0.

The integral $\tilde{c}$ can be approximated for small $b_1$ values as follows:

$$\tilde{c} = e^{i\gamma b_0 \tau}[1 - (\gamma \cdot b_1 \cdot \tau \cdot z_0)^2 + O(\gamma \cdot b_1 \tau z_0)^4] \quad 24$$

When the disturbance of the NMR signals has a contribution with m=1, e.g. it has the form of $\Phi(\phi,z) = c \cdot \cos\phi \cdot (b_0 + b_1 \cdot z)$, the integral $\tilde{c}$ has no phase factor of the type $e^{i\gamma b_0 \tau}$; $\tilde{c}$ is dependent on the dimensions of the measuring volume (in all three axes), which is also quadratic like the z extension $z_0$ in equation 24. The term c is the radius of the cylinder tube where the eddy currents flow. This is a reason why disturbances with m=1 symmetry have a considerably smaller influence on the NMR signals than those with m=0.

Conventional Methods for Improving the Shielding Effect

As already described in the paragraph Calculation of gradients, the gradients are not perfectly shielded in practice. Due to discretization of the conductor paths and due to the limited space in the z direction, the residual fields are not exactly zero which could have negative consequences for the NMR spectra as discussed in the above paragraph. The literature describes different methods and proceedings which aim to minimize the non-vanishing residual fields or the resulting eddy currents which are induced in the surrounding conducting structures. A few examples are mentioned below:

Based on perfect shielding with a continuous current distribution which may extend to any length in the z direction, it is necessary to select an arrangement of discrete conductor paths in a limited volume, which provides as good an approximation to perfect shielding as possible. The magnetic field of a selected arrangement of discrete conductor paths can be directly calculated with the Biot-Savart law. There are different conventional methods for designing the discrete conductor paths and for assessing the magnetic field that remains outside of the shielding coil in view of the generated eddy currents.

Cited reference [9] e.g. suppresses magnetic fields in the measuring volume, which are generated by the eddy currents induced by the gradient, by decomposing the fields into Fourier components $\cos(m\cdot\phi)$ and $\sin(m\cdot\phi)$. Through selection of a suitable shielding coil, the modes with low values of m (in particular m=0) are caused to disappear.

Cited reference [3] presents solutions for efficient shielding coils with iterative numerical methods in the discrete case. The residual field is minimized in the utilized optimization methods by varying the conductor cross-sections and conductor geometries.

Further methods utilize Green's functions in order to optimize the effects of non-vanishing residual fields with respect to signal disturbance in the NMR experiment. The Fourier components of optimum current densities are compared with the discretized solutions. The deviations should thereby not exceed certain limit values [12].

An established method for approximating the discrete solution as closely as possible to the theoretical current distribution is the implementation of several shielding coils connected in parallel such as e.g. in [13]. In the design of a gradient on the cylinder tube having a radius c, the discretized paths are optimized with respect to the effect of the eddy currents on the NMR signal which are induced by residual fields in the conducting structures in the near vicinity.

Production Errors

In the actual production of gradient coils, even a very efficient shielding method and precise calculation of the fields are not sufficient to obtain the theoretical residual fields due to unavoidable errors in the production process. Even very small production errors can change the optimally structured residual field in such a fashion that the eddy currents seriously disturb the NMR signal and a long waiting period is required after switching off the gradient before an NMR measurement can be carried out.

Since the induced eddy currents and their decay times greatly depend on the spatial structure of the residual field, the positions of the path structures must be very precise.

The positioning accuracy of the electrical conductors requires a precision on the order of magnitude of a few micrometers, which is a great challenge in terms of technology, in particular, when high reproducibility is required.

In accordance with prior art, the following methods are used in order to compensate for production errors.

A special case of a production error is the z misalignment [7] between the main coil and the shielding coil. This problem can be solved by using correction coils as suggested in [7] and illustrated in FIG. 3. The authors use the following method:

Use of a correction coil which is coaxial with respect to the gradient coil system and the design of which has the function of compensating for the z displacement of the main coil with respect to the shielding coil.

The correction coil is powered by a separate power supply, wherein the current is a function of the z displacement.

Eddy current artefacts that occur in the NMR signal due to production errors can i.a. be successfully suppressed using pre-emphasis [5]. Another prior art method utilizes correction coils, which are positioned coaxially with respect to the main coil or to the shielding coil at different z positions and are connected in parallel with these. This method is difficult in that the low current (in a percent range or lower) that must flow in the correction windings, must be exactly controlled using resistances. This approach is particularly difficult for gradients for use in measuring heads, which are cooled to cryogenic temperatures, due to temperature-dependent resistance values.

The Inventive Device

In contrast thereto, it is the object of the present invention to improve an actively shielded gradient coil system of the above-mentioned type with as simple as possible technical means in such a fashion that the deviation of the residual field from the desired design caused by production tolerances is modified by a correction coil in such a fashion that the long-lasting eddy currents are suppressed. This is either to reduce the waiting time that must lapse after a gradient pulse before a predetermined field homogeneity is reached, or e.g. minimize the deviation from the desired field in imaging applications.

SUMMARY OF THE INVENTION

The invention relates to a gradient coil system for use in a magnetic resonance device, namely an NMR spectrometer or an MRI scanner. A z-axis 22 is defined, which extends parallel to the main magnetic field of the magnetic resonance device and traverses the measuring volume 11. Radial and azimuthal areas refer to this z-axis 22.

The gradient coil system for generating a gradient field in the measuring volume 11 consists of a main coil 13, which takes up an area lying radially close to the z-axis 22, and provides the main contribution to the gradient field, and of a shielding coil 14, which takes up radially further outward areas and is electrically connected to the main coil such that the magnetic fields of the combined coils outside of the shielding coil are greatly reduced (FIG. 1). This is therefore an actively shielded gradient coil system.

At least one correction coil 41 is installed in the gradient coil system (FIGS. 4a, 4b) in addition to the main coil and shielding coil. The active conductor elements of this correction coil are outside of the radial areas which are taken up by the main coil 13 and the shielding coil 14. The radial areas are determined perpendicularly to the z-axis 22 for each plane. By way of one example, FIGS. 11a-c show the radial areas which are taken up by the main coil and the shielding coil and in which areas the correction coil can be positioned. This correction is designed to change the residual field, which remains outside of the shielding coil and does not correspond to the desired value due to construction errors, in such a fashion that the eddy currents, which are induced in the surroundings of the gradient coil system due to rapid switching of the current that flows in the gradient coil system, last less long compared to the gradient coil system with construction errors without correction coil.

It is the underlying purpose of the present invention to provide a versatile possibility of correcting further deviations of the parameters of the coil arrangement, which are generated by production tolerances, which constitute an improvement over the closest prior art [7] in which such a correction coil is used for compensating for a positioning error of the main coil with respect to the shielding coil. These possibly inaccurate parameters of the coil arrangement include the radii of the coil windings, the axial positions of windings relative to other windings within the main coil or shielding coil, deviations of the coil body with respect to roundness, tilting of the cylinder axis of the main coil with respect to the shielding coil, and the shifts in the azimuthal angle of the main coil and the shielding coil, which is significant for X and Y gradients.

In accordance with the invention, this object is completely achieved in a surprisingly simple but very effective fashion in that the at least one correction coil is electrically connected in series with the main coil, the shielding coil and possibly existing further correction coils, the active conductor elements of all correction coils together take up maximally one quarter of the azimuthal angle range with respect to the z-axis, and the at least one correction coil reduces the duration of eddy currents, which are induced in the vicinity of the gradient coil system due to quick changes in the current flowing in the gradient coil system in comparison with a gradient system without correction coil.

FIG. 11b illustrates a correction coil 41. The azimuthal angle range 119 taken up by the correction coil 41 is smaller than one quarter of the azimuthal angle range with respect to the z-axis, i.e. less than 90°. An azimuthal angle range of only maximally one quarter (90 degrees) of the overall range (360 degrees) is a small area compared with conventionally spanned azimuthal angle ranges of gradient coils. Z gradients are usually designed with full windings (360°). X and Y gradients are each designed from two coil arcs of 120°, i.e. they take up a total angle range of 240°. The correction coil of the closest prior art [7] also uses full windings (360°).

The fact that the main coil, the shielding coil and the correction coil are electrically connected in series guarantees that the same current flows through all coils. The effect of the correction coil remains unchanged in a gradient coil system of this type even when the resistances of individual coil components change during use. With respect to this feature, the inventive gradient coil system is advantageously distinguished from a gradient coil system with a correction coil that is connected in parallel to the main coil and the shielding coil, where the relationship of the resistance values of the parallel current paths determines the portion of the current in the correction coil. This advantage is particularly important when the gradient coil system must be cooled down to cryogenic temperatures during operation. With this type of operation, it is difficult to keep the temperature and therefore the ratio between the resistances of the individual coil components at a constant level.

From a naive point of view, the described correction coil seems to have a serious disadvantage. A correction coil that does not extend coaxially with respect to the main coil generates eddy currents with high orders m, which would not occur at all without correction coil. Considering the residual field on a periphery outside of the shielding coil, the amplitude of the residual field in the vicinity of the correction coil is at best even increased compared to the situation without correction coil. This has, however, hardly any negative effect since these eddy currents with high orders m are highly transient (as shown in FIG. 5). Since the correction coil simultaneously suppresses long-lasting eddy currents, the waiting time after a gradient pulse is consequently reduced in total.

In one particularly preferred embodiment, the correction coil is dimensioned in such a fashion that the coil cross-section of the correction coil is smaller than the coil cross-section of the main coil.

One substantial advantage of correction coils of this type having a small coil cross-section consists in that a change of the winding number of the correction coil by one winding results in a small correction step in the residual field. Adjustments of the residual field require small correction steps, since small deviations from the desired design of the main coil and of the shielding coil have a great influence on the residual field insofar as its spatial structure is changed in such a fashion that the eddy currents last for a long time. The amplitudes of the required corrections are small compared to the amplitude of the residual field tolerated in the desired design. Correction coils with small coil cross-section enable a sufficiently accurate approximation of the required corrections despite the necessity of rounding winding numbers to integer values. The spatial extension of the area of influence of the correction coils on the residual field must moreover be small so that the fine structure of the residual field can be changed. A small coil cross-section is also advantageous in this case, since the fine structure of the residual field determines the time constants of the eddy currents.

In accordance with prior art according to [7] a correction coil with large coil cross-section and a plurality of windings are used to exactly approximate the form of the residual field which is generated by a positioning error of the main coil with respect to the shielding coil. The use of a large coil cross-section and many windings results in that the full gradient current cannot be used in the correction coil since the generated fields would then exceed the typical deviations to be corrected by multiple factors. In order to be able to adjust the actually required strength in sufficiently fine steps, a second gradient amplifier 32 is used which supplies a current to the correction coil, which is proportional to the current in the main coil and shielding coil. The object of exactly adjusting the strength of correction is thereby transferred to adjustment of a current in sufficiently fine steps. The inventive gradient coil system is advantageous compared to this approach in that the additional gradient amplifier is omitted.

The correction coil is preferably designed in such a fashion that it comprises individual serially connected windings at different z positions. The local deviations of the coils from the desired design can be compensated for in this fashion by a spatially close correction winding. Correction coils for transverse gradients (Y and Y gradients) are preferably designed in such a fashion that they comprise individual serially connected windings at different angle positions. In this fashion, a correction coil can be designed which maintains the symmetry of the gradient field to be corrected. Local deviations of the coils from the desired design may also show an angular dependence. In this case, correction coils with individual serially connected windings at different angle positions are also suitable for Z gradients. The sign of the correction within the correction coil can be changed in that the individual windings of the correction coil have different winding directions.

The correction coils are preferably wound onto their own coil body 42, the cross-section of which utilizes the available space to a good extent. Simple geometries of such a coil body have a cross-section perpendicular to the z-axis which is round, elliptical or rectangular. The cross-sectional surface and the position within the gradient coil system play an essential role for the effect of the correction coil. To a certain degree, the cross-sectional shape may be adjusted to the geometrical boundary conditions.

In one particularly preferred embodiment, the correction coil is located in the space between the main coil and the shielding coil. The geometrical interfaces to the surroundings of the gradient coil system thereby remain unchanged. One further advantage of this arrangement is the possibility of using a volume, which is otherwise unused, between the main coil and the shielding coil for improving the gradient coil system. The correction coils can moreover be mounted without contacting or changing the existing main and shielding coils. The effect of errors can thereby be minimized in a late phase of the production process, in particular, after an irreversible step such as e.g. casting of the coils with epoxy resin. In this fashion, the correction coil contributes to a reduction of the reject rate and selection of more favorable production methods.

In one particularly preferred embodiment, three electrically independent gradient coil systems are combined in one measuring arrangement, wherein the three partial systems generate field gradients, the gradient directions of which are pair wise perpendicular to each other. With an arrangement of this type, a so-called XYZ gradient, coordinates of all three spatial directions can be encoded by field gradients, which is important, in particular, for imaging applications. In this connection, each of the three partial systems consists of a main coil, a shielding coil and at least one correction coil.

In case a residual field with a component with m=1 is observed in the present gradient coil system, it must be possible to correct this component with m=1 irrespective of a generated component with m=0. The correction coil must, in particular, not generate a component with m=0 if the residual field does not require a correction in m=0. Terms with m≥2 are allowed since they decay quickly (see FIG. 5). Arrangements for generating or correcting a residual field with a component with m=1, which moreover do not generate a component with m=0, can be formed at opposite angle positions (preferably at angle positions opposed from each other by 180°) by connecting two correction coils with opposite winding directions. An arrangement of this type is illustrated in FIG. 4c.

Residual fields with a component with m=1 have a cos(φ)- or sin(φ)-symmetry. For covering these two cases, two pairs of connected correction coils in two directions that are perpendicular with respect to each other, are needed, e.g. one pair on the x-axis and one pair on the y-axis.

Conversely, a simple correction coil for compensation of a component with m=0, which only comprises windings at one single angle position, also generates a portion of the residual field with a component with m=1 in addition to the high orders in m (m≥2), which quickly decay. The component with m=1 has indeed a smaller amplitude than the component with m=0, but decays at a comparatively low speed like the component with m=0. It may happen that a component with m=1, which newly occurs as a side effect of the correction for m=0, still excessively disturbs the result of the magnetic resonance measurement. In this case, one can achieve correction of a residual field with a component with m=0 by connecting two correction coils with identical winding direction at opposite angle positions (at angle positions preferably opposed to each other by 180°), at the same time suppressing generation of a residual field with a component with m=1. An arrangement of this type is illustrated in FIG. 4d. In comparison with the above-mentioned simple correction coil, the coil cross-section or the winding number of the partial coils must be halved for the two-part correction coil in order to generate a component with m=0 of the same strength.

Modern MRI systems are constructed as compact units which accommodate the magnet for generating the static magnetic field which is homogeneous in the measuring volume, the RF transmitting and receiving system, and the gradient coil system in a common housing. For this reason, the inventive gradient coil system is preferably installed in an MRI system together with the magnet and the RF transmitting and receiving system.

In NMR spectroscopy, the magnet for generating the static magnetic field, which is homogeneous in the measuring volume, is a unit of its own. The measuring head, which contains an RF transmitting and receiving system as well as a gradient coil system, forms a separate unit which can be replaced. In dependence on the requirements of the experiment, a different measuring head can be selected and be installed in the magnet. For this reason, a preferred embodiment of the invention concerns a measuring head for NMR spectroscopy which contains an RF transmitting and receiving system as well as an inventive gradient coil system.

When the required correction has been determined, mechanical processing of the coil carriers of the gradient coils is no longer allowed and their relative positions must not be changed. For this reason, in a further embodiment, the coil carriers of the gradient coils leave open a free space at defined locations for receiving a possibly required correction coil such that the correction coil can be installed into the gradient coil system after termination of assembly of the gradient coils without changing their mutual alignment.

For configuring the correction coils of a gradient coil system in such a fashion that the decay times of the eddy currents become short, information is required about the residual field of the actual coil arrangement of one single gradient coil. Measuring results from the residual field are obtained by forming and measuring a preliminary, already largely shielded gradient coil system of main coil and shielding coils. A coil design with discrete windings always generates a residual field which is not exactly zero, and for this reason, the actual residual field is compared with the desired residual field allowed by the design for determining the structural differences. A specific model of the surroundings of the gradient coil system can be used for determining the design and therefore the desired residual field. The present invention explicitly claims neither the method that produces this design, nor a specific model of the eddy currents. It is sufficient to know the desired residual field for configuring the correction coil.

One particularly suited measured variable for evaluating the residual field is the voltage, which is induced upon change of the current flowing in the gradient coil system, in a ring with fixed radius outside of the shielding coil, the radius being designated by c in the embodiment below. This induction voltage can be measured at different z positions and for this reason, the structure of the actual residual field can be detected. When the coil design is known, the induction voltage which is expected due to the desired residual field can also be calculated at these positions. The influence of individual windings of a correction coil on these inductance voltages can also be calculated. In case the field gradients are X or Y gradients, eddy currents of the order m=1 also play a role and it is not sufficient to measure the induction voltage in a ring which extends around the gradient coil system, since this measuring arrangement is only sensitive to the order m=0. Saddle coils offer a suitable geometry for measuring residual fields with angular dependence. In this case, the induction voltages must be measured both for different z positions and also for different angles.

The difference between the calculated induced voltage of the desired residual field and the measured induced voltage of the actual residual field characterizes the deviations caused by the production tolerances. This difference together with the induced voltage of the correction coil still to be determined should, if possible, not cause any long-lasting eddy currents. The decay times of eddy currents generally become short when they change the winding direction several times in the z direction or when the basic induction voltage has several zeros. More zeros in the z direction correspond to a higher wave number k and analogously more zeros in φ direction correspond to a higher order m. For this reason, positions, winding numbers and winding directions for the individual windings of the correction coil are preferably determined in such a fashion that the above calculated difference between the induced voltages together with the induced voltages from the correction coil have as many zero passages as possible.

A method which is particularly suited for producing actively shielded gradient coil systems with very short decay times of the eddy currents therefore comprises the following steps:

a) Determining a coil arrangement for the gradient coils.
b) Calculating the induced voltage which is generated during switching of a current through the coil arrangement at a fixed radius which is larger than the largest radius of the gradient coil system at different positions along the z-axis.
c) Configuration of a preliminary gradient coil system consisting of at least two gradient coils.
d) Measuring the induced voltage at the points for which the induced voltage was calculated.
e) Calculation of the difference between calculated induced voltage and measured induced voltage.
f) Determination of positions, winding numbers, winding directions for at least one correction coil such that the above calculated difference between the induced voltages plus the induced voltages of the at least one correction coil have as many zero passages as possible.
g) Production of the at least one correction coil and installation into the gradient coil system.
h) monitoring the improvement caused by at least one correction coil based on the induced voltage. Repeating steps e)-g) until the deviation between the voltages measured in step d) and the voltages calculated in step b) is as small as desired.

BRIEF DESCRIPTION OF THE DRAWING

FIG. 2a gradient coil system according to prior art. The arrangement of the windings of a Z gradient coil is outlined. The main coil and the shielding coil are illustrated in a not yet assembled state.

FIG. 2b gradient coil system according to prior art in the assembled state and connected to the gradient amplifier. The main coil and the shielding coil are only shown in a simplified fashion.

FIG. 11a longitudinal section through the gradient coil system. The plane of intersection extends through the z-axis 22. Sections through the wires of the individual coil windings are illustrated. The z positions of the two cross-sections are designated by 111 and 112, respectively.

FIG. 11b cross-section at a first z position 111. The radial area of the main coil is limited by a minimum radius 113 and a maximum radius 114. The shielding coil occupies two radial areas that are limited by a minimum radius 115 and a maximum radius 116 or by a minimum radius 117 and a maximum radius 118. A correction coil 41 is disposed in this plane of intersection. The azimuthal angle range 119 is considerably smaller than 90 degrees.

FIG. 11c cross-section at a second z position 112.

DESCRIPTION OF THE PREFERRED EMBODIMENT

Figure 1:
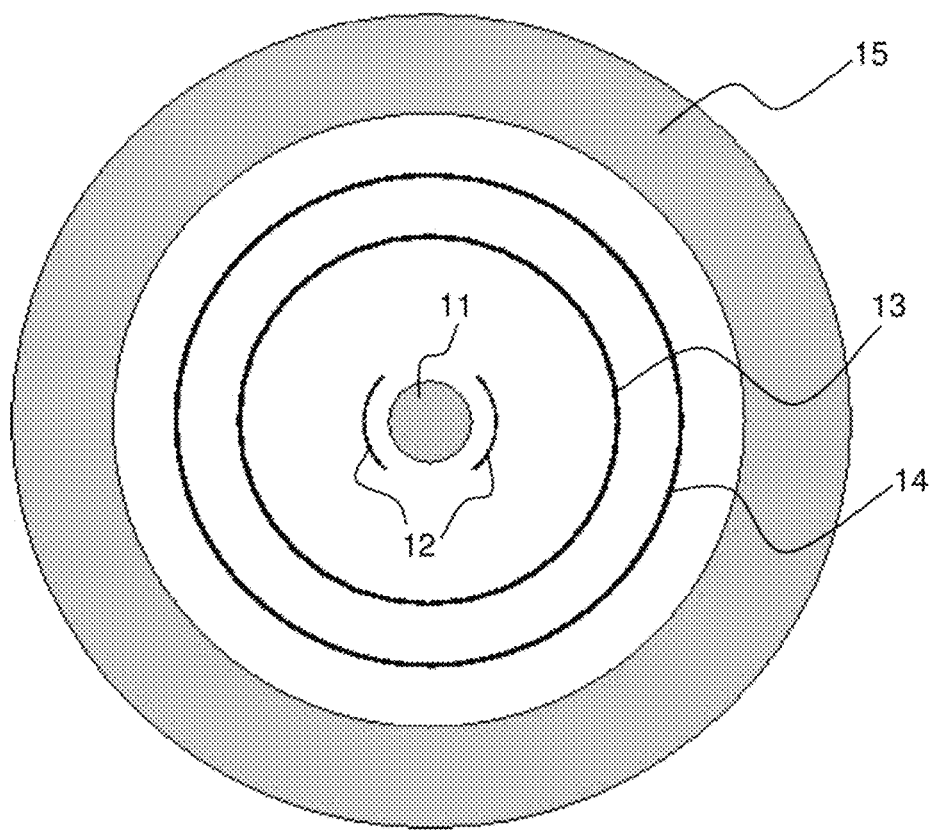
FIG. 1 cross-section through a magnetic resonance apparatus showing, from the inside to the outside, the measuring volume 11, an RF coil 12, the main coil 13 and the shielding coil 14 of the gradient coil system and the conductive structures 15 outside of the gradient coil system. In particular, the conductive structures also include elements having the temperature of liquid helium or liquid nitrogen like the coil body of the superconducting magnet and the walls of the container for these liquids.
Figure 3:
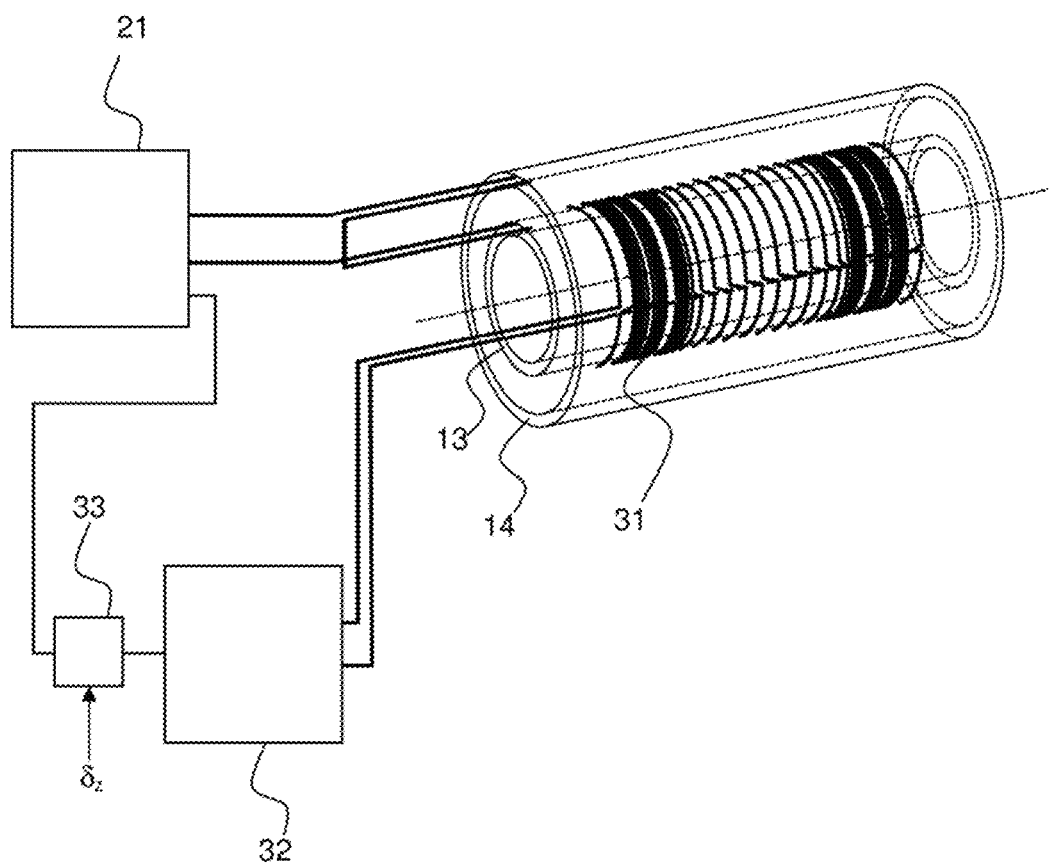
FIG. 3 gradient coil system with correction coil for compensation of a positioning error of the main coil relative to the shielding coil. Prior art according to [7]. The correction coil is wound over the main coil and is supplied with current from its own gradient amplifier.

The magnetic residual fields of the gradient coil system on the cylinder tube with radius c are described below by the vector potentials on the cylinder surface c.

Let $\vec{A}^{Soll,c}$ be the desired vector potential that is generated due to the non-vanishing external residual fields. Since these are external residual fields c>b applies (wherein b is the outer radius of the shielding coil). $\vec{A}^{Soll,c}$ is determined in the design of the gradient coil system and is generated by discretization of the currents both in the main coil and also in the shielding coil and by the limited space in the z direction. This vector potential is already optimized with respect to the effects of the induced eddy currents, which flow on the cylinder tube after switching the current in the gradient coil system, on the NMR signal. For an actual coil arrangement of one single gradient coil, let $\vec{A}^{Ist,c}$ be the actual vector potential on the same cylinder tube. Due to production tolerances during the production process, deviations between $\vec{A}^{Ist,c}$ and $\vec{A}^{Soll,c}$ can be generated. This deviation is described by the vector potential $\vec{A}^{Abw,c}$ such that $$\vec{A}^{Abw,c} = \vec{A}^{Ist,c} - \vec{A}^{Soll,c} \qquad 25$$

Only the deviations of the vector potential $\vec{A}^{Abw,c}$ are observed. It is the object of the correction winding to generate a vector potential $\vec{A}^{Korr,c}$ on the cylinder surface with radius c such that the residual vector potential $\vec{A}^{Re\ s,c}$ $$\vec{A}^{Re\ s,c} = \vec{A}^{Abw,c} + \vec{A}^{Korr,c} \qquad 26$$

is characterized by a smaller amplitude and a finer structure in m and k than $\vec{A}^{Abw,c}$. It is the object of $\vec{A}^{Korr,c}$ to optimally suppress the portions of $\vec{A}^{Abw,c}$ which have low m and k values (which last longer according to equation 15).

Assuming that the conductivity in each observed cylinder is constant, the vector potential $\vec{A}^{Re\,s,c}$ according to equation 9 is proportional to the induced eddy currents $\vec{j}^{Wirb,c}$ and therefore has the same structure as $\vec{j}^{Wirb,c}$ both with respect to k and m. For this reason, vector potentials can be used for optimizing the correction coil.

Example of a Correction Coil in the Form of a Ring

Construction defects and spatial inaccuracies in the conductor structures in the gradient coil system or in parts thereof change the residual field.

These residual fields can be measured directly using a Hall sensor or indirectly by the induced voltage in a pick-up loop.

This example relates to the special case of a z gradient coil system. In a first approximation, the residual field is rotationally symmetrical with respect to the z-axis. The residual fields can be picked up along the z-axis by a circular pick up coil which is positioned coaxially with respect to the gradient coil system and has a radius c which is larger than the outer radius of the shielding coil. The residual fields are described by the vector potential $\vec{A}^{Ist,c}$. Due to the selected geometry, only the $\phi$ component $\vec{A}_\phi^{Ist,c}$ is unequal to zero. The gradient coil system is operated by an alternating current $(\omega=2\cdot\pi\cdot\nu)$ for example $I_{Grad}(t)=\bar{I}_{Grad}\sin(\omega\cdot t)$; wherein $\bar{I}_{Grad}$ is constant with time. The time-dependent magnetic flux of the gradient coil system in the z direction $\int_S B_z^{Ist,c}(z,t)\cdot dS$ induces a voltage $V_{ind}$ in the pick-up coil which can be written as follows using the Stokes equation $$V_{ind}(c,z,t) = \qquad 27$$

$$\frac{d}{dt}\int_S B_z^{Ist,c}(z,t) = \frac{d}{dt}\int_S rot(A_\phi^{Ist,c}(z,t))\cdot dS = \frac{d}{dt}\int_C A_\phi^{Ist,c}(z,t)\cdot ds$$

S is the surface of the pick-up coil ($S=\pi\cdot c^2$) and C its circumference ($C=2\cdot\pi\cdot c$). The induced voltage $V_{ind}$ can also be derived by means of equation 8.

The vector potential $A_\phi^{Ist,c}(z,t)$ on the pick-up coil, which is generated by the gradient coil system, depends with respect to time only on the current $I_{Grad}(t)$ that flows in the gradient coil system, for this reason, $A_\phi^{Ist,c}(z,t)=I_{Grad}(t)\cdot \overline{A}_\phi^{Ist,c}(z)$ wherein $\overline{A}_\phi^{Ist,c}(z)$ is constant with time. For this reason, the dependence of the induced voltage on the pick-up coil is integrated over the circumference C $\overline{A}_\phi^{Ist,c}(z)$ as follows $$V_{ind}(c,z,t) = \qquad 28$$

$$2\pi\cdot c\cdot \overline{A}_\phi^{Ist,c}(z)\cdot\frac{d}{dt}(I_{Grad}(t)) = 2\pi\cdot c\cdot \overline{A}_\phi^{Ist,c}(z)\cdot \bar{I}_{Grad}\cdot\omega\cdot\cos(\omega\cdot t).$$

The induced voltage $V_{ind}$ can be measured with simple means.

A winding in the form of a ring with an axis parallel to the z-axis, a current $I^{Ring}$, a radius $a^{Ring}$ with center in the origin and disposed in the plane of the x and y axes generates on the cylinder tube with radius c a vector potential $A_\phi^{Ring}$ $(a^{Ring},c,\phi,z)$ of the form $$A_\phi^{Ring}(a^{Ring},c,\phi,z) = \qquad 29$$

$$\frac{I^{Ring}\mu_0\sqrt{(a^{Ring}+c)^2+z^2}}{2\pi\cdot c}\left(\frac{(a^{Ring})^2+c^2+z^2}{(a^{Ring}+c)^2+z^2}K(\tilde{m})-E(\tilde{m})\right)$$

wherein $E(\tilde{m})$ and $K(\tilde{m})$ are the elliptic integrals and $\tilde{m}$ is defined as $$\tilde{m} = \frac{4a^{Ring}c}{(a^{Ring}+c)^2+z^2}.$$

When the current flows in the cylinder surface only in the $\phi$ direction, the other components of the vector potential are zero $$A_\rho^{Ring}(a^{Ring},c,\phi,z)=A_z^{Ring}(a^{Ring},c,\phi,z)=0.$$

When the x-axis of the correction winding is shifted by $x_0$ and the z-axis is shifted by $z_0$ the vector potential of the shifted correction winding at the plane $z=z_0$ is given by $$A_\phi^{Ring\_versch}(a^{Ring},c,\phi,z) = \frac{c-x_0\cos\phi}{c^{versch}}A_\phi^{Ring}(a^{Ring},c^{versch},z^{versch}), \qquad 30$$

wherein $c^{versch}+\sqrt{x_0^2+c^2-2x_0 c\cos\phi}$ and $z^{versch}=z-z_0$. The further components of the vector potential in the shifted coordinate system are either not present (the z component) or not relevant (the radial component) when the cylinder layers are thin. In the Fourier space the term 30 is $$\hat{A}_\phi^{Ring\_versch}(a^{Ring},c,m,z) = \int_{-\pi}^{+\pi}e^{-im\phi}A_\phi^{Ring\_versch}(a^{Ring},c^{versch},z)\cdot d\phi \qquad 31$$

The m=0 component of 31 is $$\hat{A}_\phi^{Ring\_versch}(a^{Ring},c,m=0,z) = \qquad 32$$

$$\frac{1}{2\cdot\pi}\int_0^{2\pi}A_\phi^{Ring\_versch}(a^{Ring},c^{versch},z^{versch})\cdot d\phi$$

A correction winding, which is not positioned coaxially with respect to the conducting cylinder structures, generates eddy currents with higher orders in m, which do not occur without correction coil. These have only little disturbing influence since firstly the contributions of 31 with m>0 have a smaller amplitude than those with m=0 and secondly the contributions with m>1 decay more quickly than those with m=0 and m=1.

Figure 4A:
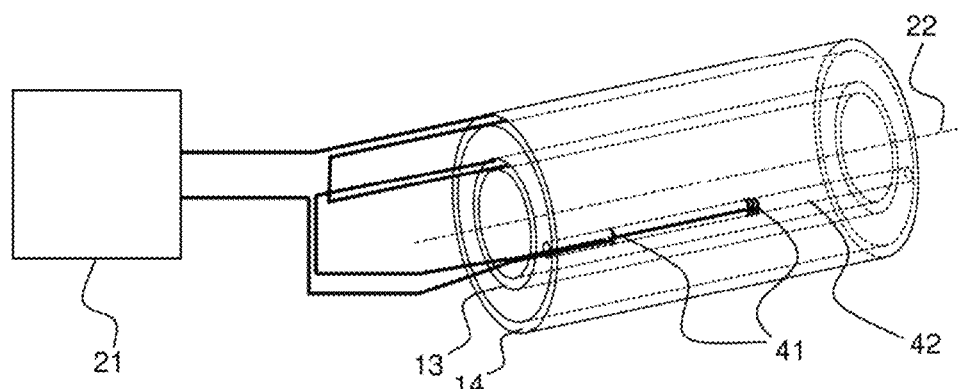
FIG. 4a Inventive gradient coil system with correction coil 41. The correction coil is connected in series with the main coil and the shielding coil.
Figure 4B:
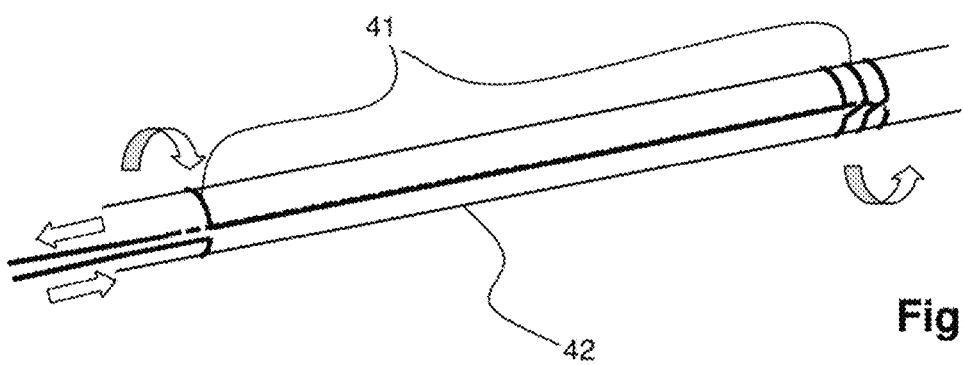
FIG. 4b enlarged view of the correction coil of FIG. 4a. The arrows show the direction of the current in the feed line and the winding direction of the coils.
Figure 4C:
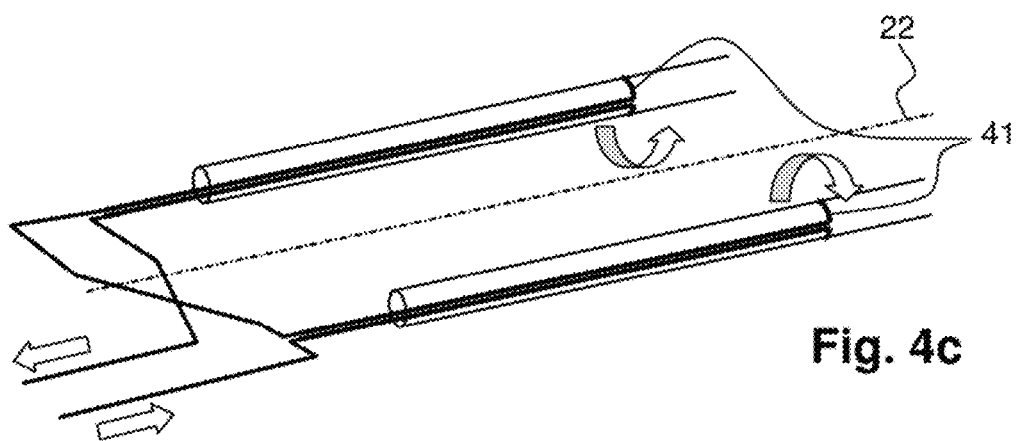
FIG. 4c a pair of correction coils with opposite winding direction on opposite sides of the z-axis. Such a pair of correction coils can compensate for a residual field with component m=1 without thereby generating an m=0 component.
Figure 4D:
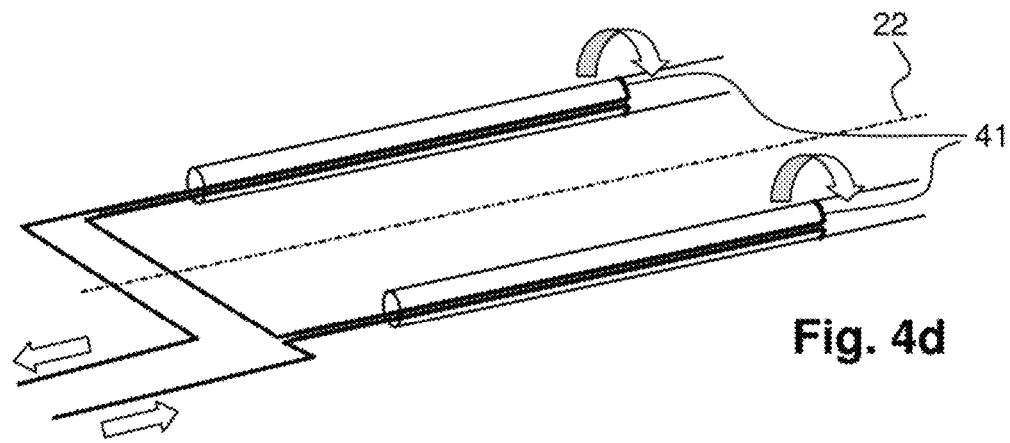
FIG. 4d a pair of correction coils with identical winding direction on opposite sides of the z-axis. Such a pair of correction coils can compensate for a residual field with component m=0 without thereby generating a component m=1.
Figure 5:
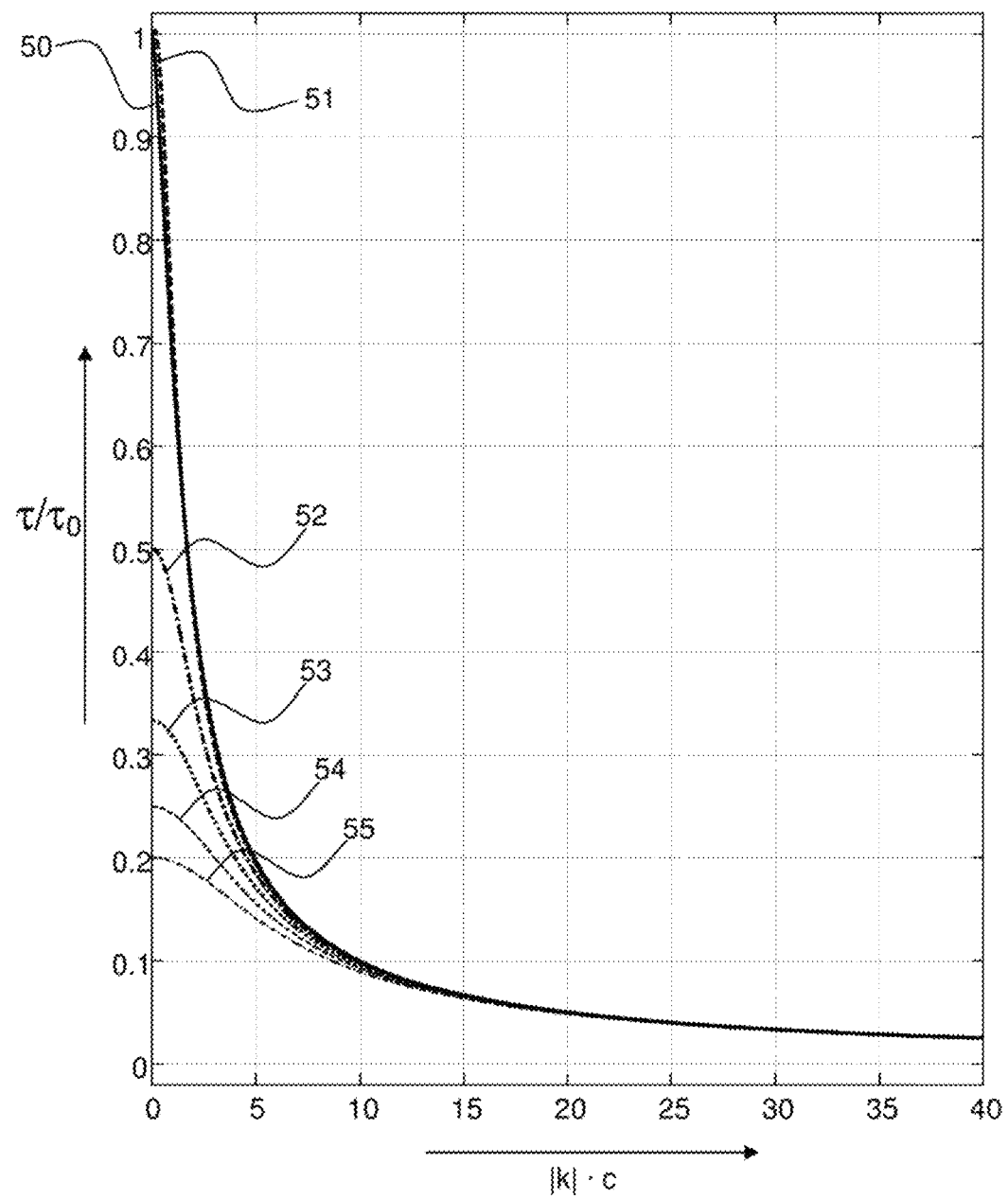
FIG. 5 relative decay times of eddy current modes on a thin-walled cylinder. Each order m (m=0, m=1, m=2) has its own illustrated curve. The times are normalized to the decay time $\tau_0$ of the mode with m=0 and k=0.

If the contributions with m=1 have a considerable effect on the residual field, correction coils with a $\cos(\phi)$ symmetry like in FIG. 4c and FIG. 4d are to be used.

If the measuring volume is spatially more extended in the z-axis than in the x or y axes (which is generally the case in high-resolution NMR spectroscopy and MRI) the contribution which is independent of $\phi$ (m=0) has a larger influence on the NMR signal than the components which are dependent on $\phi$ (m>0). In this case, the component with m=1 is of minor priority. Disturbances which depend on $\phi$ are moreover less serious than those with component m=0 in accordance with the argumentation in the paragraph Effect of the eddy currents on the NMR signal since there is no phase error in the signal. The influence of the geometry of the measuring volume on the distortion of the NMR signal is described in equation 19.

The following is a calculation of a specific example.

Figure 6:
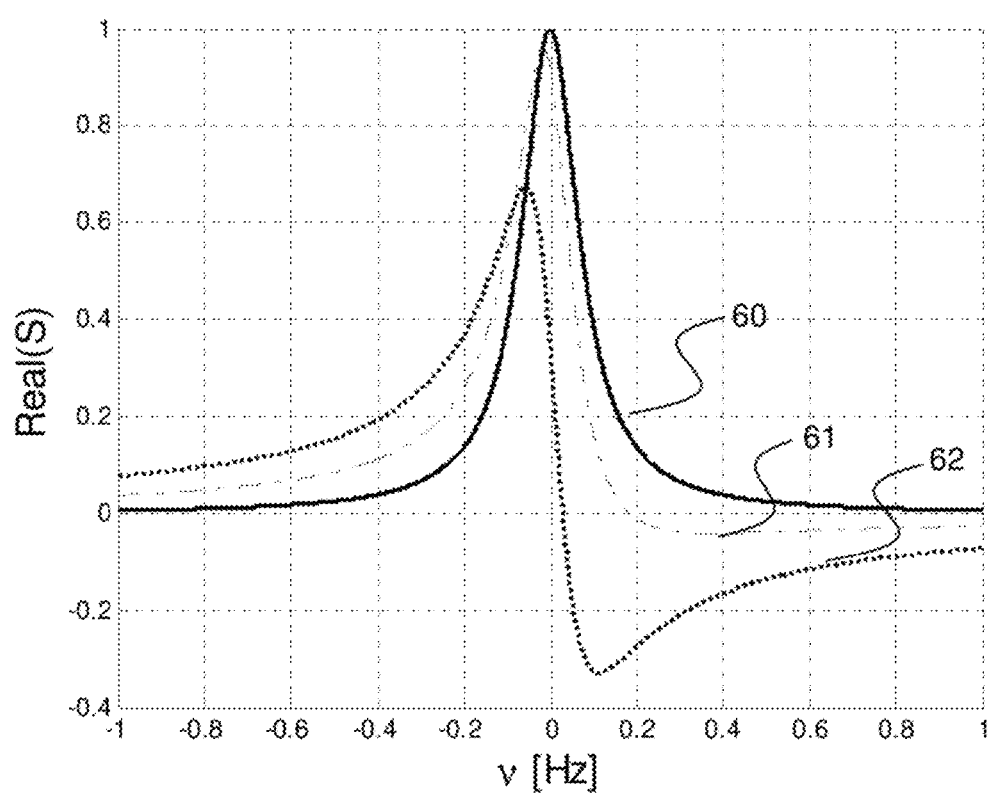
FIG. 6 influence of eddy currents on the NMR signal. The magnetic field generated by the eddy currents in the measuring volume has the form $B^{Wirb}(z)=b_0$. The signal was calculated for different values of $b_0$ (61 and 62) and compared with the undisturbed signal ($b_0$=0) (60).
Figure 7:
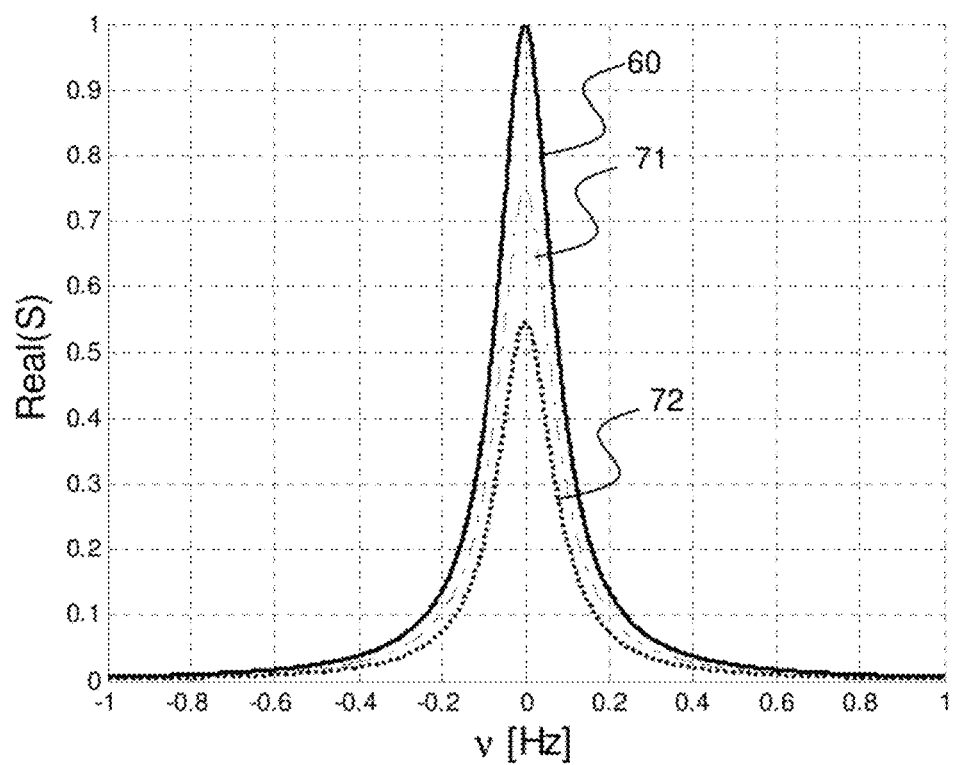
FIG. 7 influence of eddy currents on the NMR signal. The magnetic field generated by the eddy currents in the measuring volume has the form $B^{Wirb}(z))=b_1 \cdot z$. The signal was calculated for different values of $b_1$ (71 and 72) and compared with the undisturbed signal ($b_1$=0) (60).
Figure 8:
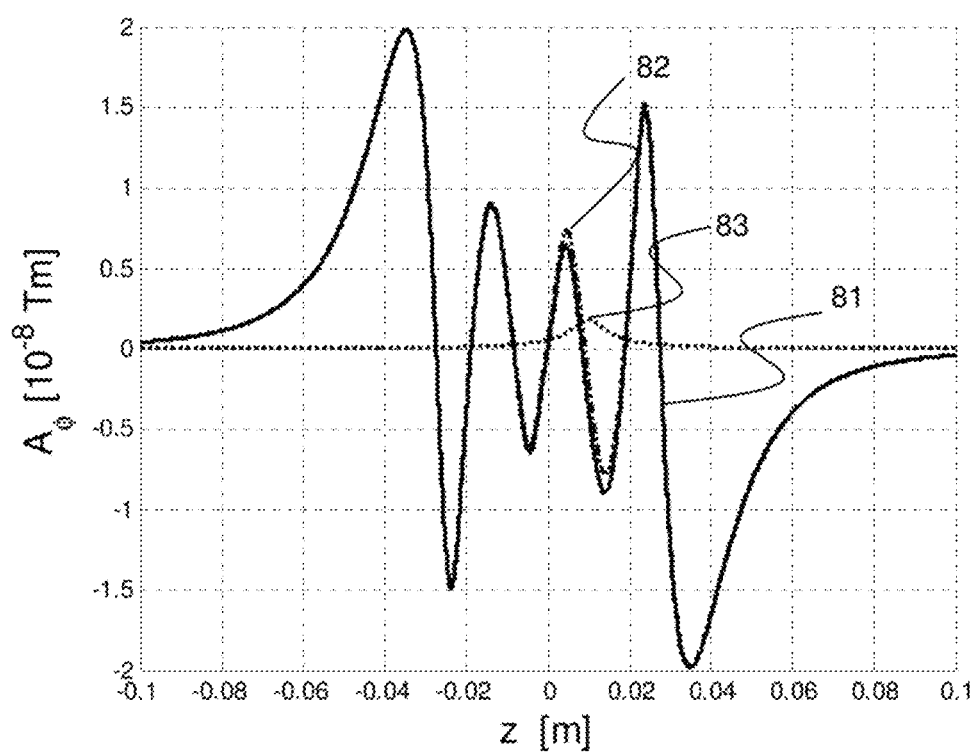
FIG. 8 influence on the vector potential of a z gradient in case that an individual winding 23 in the shielding coil 14 is not correctly positioned. The vector potentials were calculated on the cylinder surface with radius c=22.0 mm (larger than that of the shielding coil).

It is assumed that one single winding 23 in the shielding coil is not correctly positioned in a z gradient coil system. The winding has a separation of z=10 mm from the magnetic center in the z-axis. The desired radius of the winding $\rho^{Soll}$ is 17.0 mm and the actual radius $\rho^{Ist}$ is larger by 40 μm ($\rho^{Ist}=\rho^{Soll}+40$ μm). The φ component of the vector potential which is generated on the cylinder tube with radius c=22 mm when the current $I_{Grad}=1$ A flows in the gradient coil system is shown in FIG. 8. The solid line (81) is the desired vector potential $\overline{A}_\phi^{Soll,c}(z)$ and the broken line 82 is the actual vector potential $\overline{A}_\phi^{Ist,c}(z)$ of the gradient coil system with the incorrectly positioned winding. The dotted curve 83 is the deviation $\overline{A}_\phi^{Abw,c}(z)$, i.e. the difference between 81 and 82. The eddy currents induced by this deviation generate a magnetic field in the z-axis, which is of the same order of magnitude as the curve 61 of FIG. 6. A deviation of the radius of 40 μm is not unusual in the production process.

The above example relates to an individual incorrect dimension. If the positions of several windings are incorrect, even smaller deviations of the radius are sufficient to considerably reduce the NMR signal quality. Moreover, the currents are usually considerably higher than 1 A.

Figure 9:
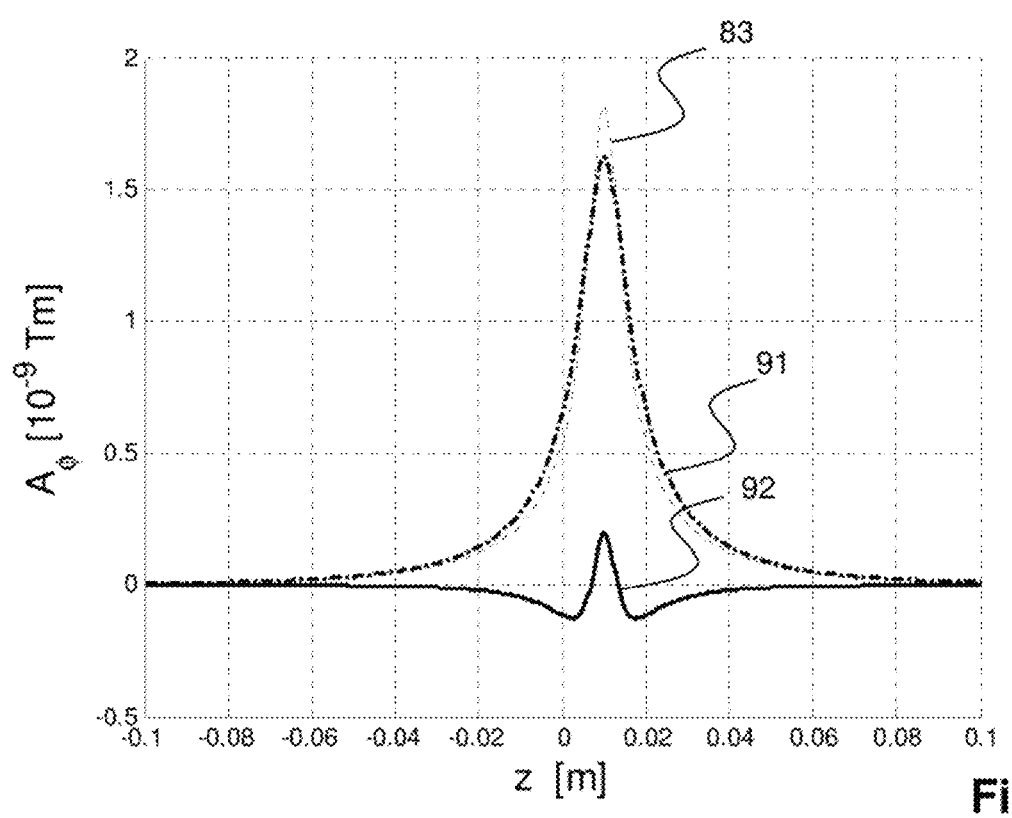
FIG. 9 specific example for the use of a correction coil 41 on a z gradient in case that one single winding 23 in the shielding coil 14 is not correctly positioned. The correction coil generates a vector potential 91 on the cylinder surface with radius c=22 mm (larger than that of the shielding coil), wherein the vector potential 91 ensures that the deviation 83 between the actual vector potential 82 and the desired vector potential 81 is compensated for 92.
Figure 10:
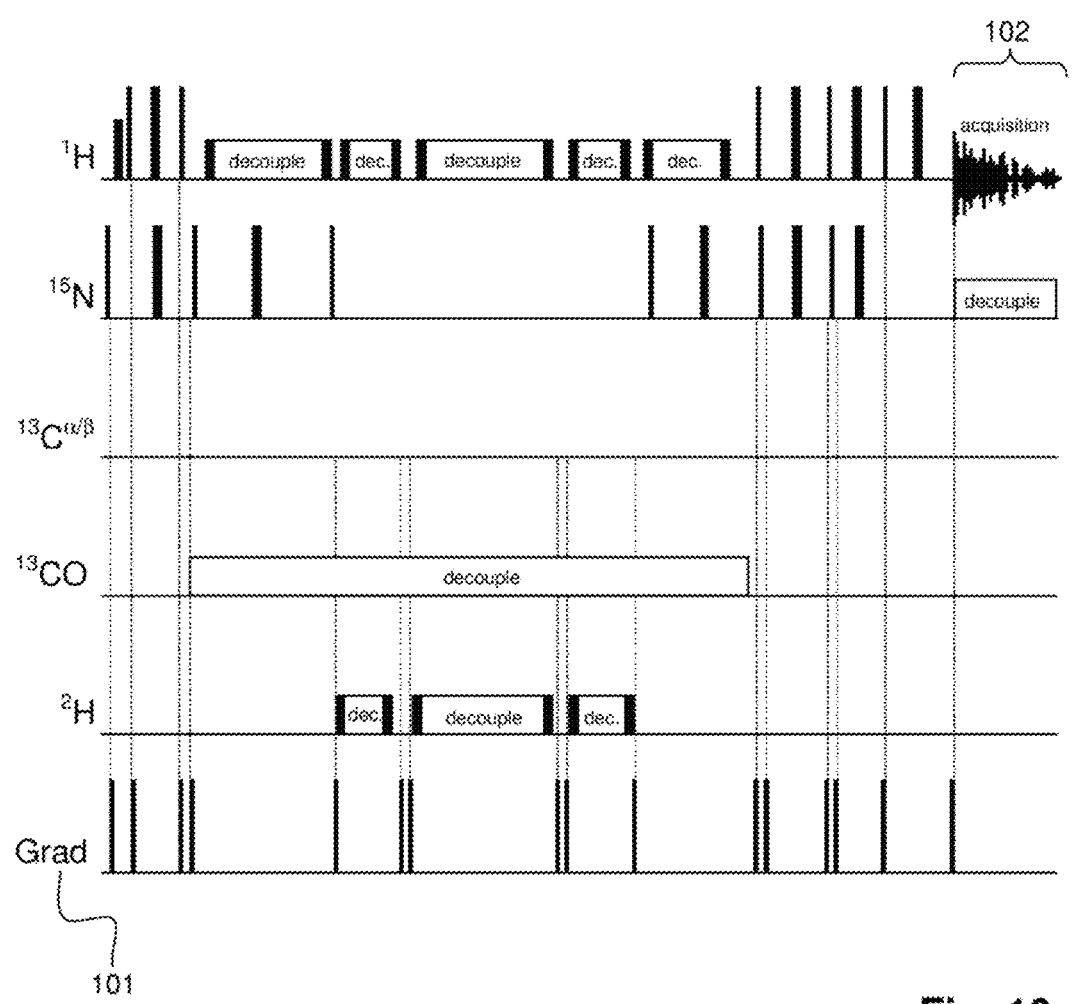
FIG. 10 schematic illustration of the pulse sequence for a 3D HN(CA)CB experiment suitable for deuterated proteins in accordance with [13] page 738. The time sequence of the pulses on the RF channels (1H, 15N, 13C, 2H) and on the gradient channel (labelled as "Grad") are illustrated. For simplification, the phases of the pulses and time intervals were not marked. Thin and thick bars represent 90° or 180° pulses on RF channels. Gradient pulses are shown with thin bars on the gradient channel. Short, wide bars mean selective 90-degree pulses on water. It is to be noted, in particular, that a gradient pulse is switched sixteen times between the first excitation pulse for 15N and the start of acquisition.
Figures 11A, 11B, 11C:
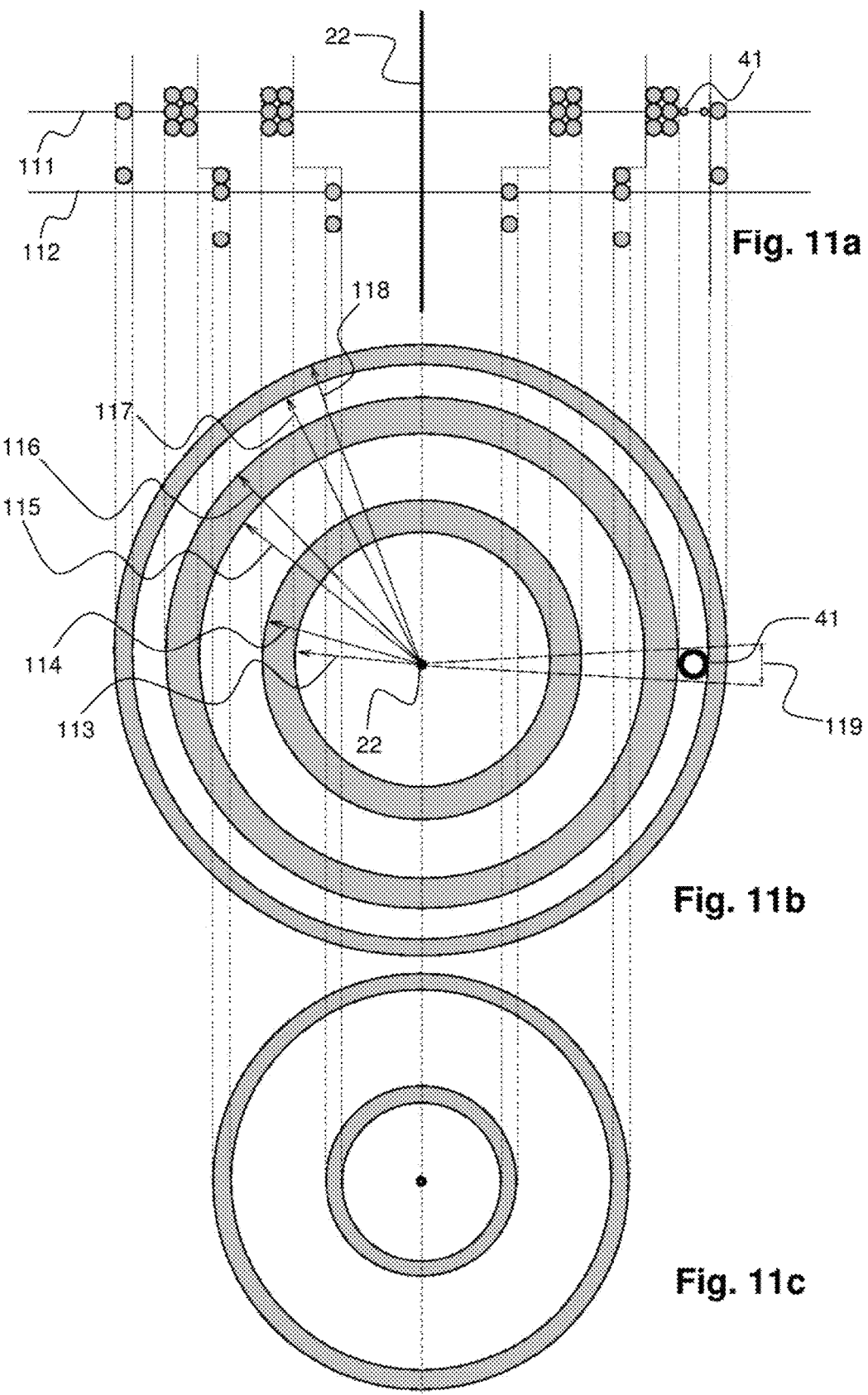
FIG. 11a-c illustration of the position of the different radial areas showing a longitudinal section and two cross-sections through a gradient coil system. The planes of intersection of the cross-sections extend at two different z positions perpendicularly to the z-axis (22). Radial positions that belong together are connected by dashed lines that extend across the partial figures FIG. 11a to FIG. 11c.

A correction coil in the form of a circular loop with N=1 windings with radius $a^{Ring}=1.2$ mm and a shift in the z-axis of $z_0=10$ mm and in the x-axis of $x_0=15$ mm is connected in series with the gradient coil system. The vector potential 91 of the correction coil on the cylinder with radius c is $\overline{A}_\phi^{Korr,c}(z)$. The calculation is performed in accordance with equation 30 and as illustrated in FIG. 9. The deviation of the vector potential $\overline{A}_\phi^{Abw,c}(z)$ due to the incorrectly positioned winding 83 is also illustrated for comparison. The curve 92 is the residual $\overline{A}_\phi^{Re\,s,c}(z)$ of 83 $\overline{A}_\phi^{Abw,c}(z)$ and 91 $\overline{A}_\phi^{Korr,c}(z)$. Due to application of the correction winding, the deviation from the desired vector potential is not only smaller in amplitude than 83 but also characterized by higher components of the wave number k. This shortens the decay times of the eddy currents induced by the gradients on the cylinder.

This embodiment clearly shows that use of correction coils in accordance with the invention is advantageous in case of production errors that occur in the production of gradient coil systems. The fact that this inventive idea can be realized in practice in a simple fashion is also of advantage.

LIST OF REFERENCE NUMERALS 11 measuring volume
12 RF coil
13 main coil
14 shielding coil
15 conductive structures outside of the gradient coil system
21 gradient amplifier
22 z-axis
23 individual winding in the shielding coil, flawed with radius errors in the embodiment
31 longitudinal correction coil according to [7]
32 gradient amplifier for the correction coil according to [7]
33 apparatus for determining the fraction of the current for the correction coil as a function of the axis shift of main coil and shielding coil
41 inventive correction coil
42 coil body for the inventive correction coil
50 relative decay time of the eddy current mode with m=0 in dependence on the wave number k in case of a thin cylinder with radius c.
51 relative decay time of the eddy current mode with m=1 in dependence on the wave number k in case of a thin cylinder with radius c.
52 relative decay time of the eddy current mode with m=2 in dependence on the wave number k in case of a thin cylinder with radius c.
53 relative decay time of the eddy current mode with m=3 in dependence on the wave number k in case of a thin cylinder with radius c.
54 relative decay time of the eddy current mode with m=4 in dependence on the wave number k in case of a thin cylinder with radius c.
55 relative decay time of the eddy current mode with m=5 in dependence on the wave number k in case of a thin cylinder with radius c.
60 NMR signal in the ideal case without eddy currents.
61 NMR signal in case of a magnetic field induced by eddy currents $B^{Wirb}(z)=b_0$ and $b_0=1 \cdot 10^{-7}$ T.
62 NMR signal in case of a magnetic field induced by eddy currents $B^{Wirb}(z)=b_0$ and $b_0=3 \cdot 10^{-7}$ T.
71 NMR-Signal in case of a magnetic field induced by eddy currents $B^{Wirb}(z)=b_1 z$ and $b_1=5 \cdot 10^{-7}$ T/m.
72 NMR-Signal in case of a magnetic field induced by eddy currents $B^{Wirb}(z)=b_1 z$ and $b_1=7 \cdot 10^{-7}$ T/m.
81 desired vector potential of a z gradient on the cylinder surface c=22 mm.
82 actual vector potential of a z gradient on the cylinder surface c=22 mm when an individual winding at z=10 mm is radially incorrectly positioned by 40 μm.
83 difference between the desired vector potential 81 and the actual vector potential 82.
91 vector potential of a correction coil on the cylinder surface c=22 mm. The correction coil consists of a circular coil arrangement consisting of a winding with radius 1.2 mm. The position is shifted with respect to the origin by 15 mm in a radial direction and by 10 mm in the z direction.
92 difference between the vector potential 83 to be corrected and the correction coil vector potential 91.
101 gradient channel in the pulse sequence
102 acquisition time in the pulse sequence
111 z position of a first cross-section through the gradient coil system
112 z position of a second cross-section through the gradient coil system
113 minimum radius r_min_1(z) of the radial area of the main coil
114 maximum radius r_max_1(z) of the radial area of the main coil
115 minimum radius r_min_2(z) of a first radial area of the shielding coil
116 maximum radius r_max_2(z) of a first radial area of the shielding coil
117 minimum radius r_min_3(z) of a second radial area of the shielding coil
118 maximum radius r_max_3(z) of a second radial area of the shielding coil
119 azimuthal angle area of the correction coil at the z position 111

REFERENCE LIST

[1] R. Turner, "*A target field approach to optimal coil design*" J. Phys. D: Appl. Phys., vol 19, (1986)

[2] U.S. Pat. No. 4,737,716
[3] U.S. Pat. No. 4,978,920
[4] U.S. Pat. No. 4,896,129
[5] C. B. Ahn, Z. H. Cho, "*Analysis of the eddy current induced artifacts and the temporal compensation in nuclear magnetic resonance*" IEEE Transactions on Medical Imaging vol 10, Nr 1, (1991)
[6] R. Turner, "*Gradient coil design: a review of methods*" Magnetic Resonance Imaging vol 11, (1993)
[7] U.S. Pat. No. 5,742,164
[8] T. Parella, "*Pulsed field Gradients: a new tool for routine NMR*", Magnetic Resonance in Chemistry 36 (1998)
[9] U.S. Pat. No. 6,456,076
[10] B. Antalek, "*Using pulsed field gradient spin echo NMR for chemical mixture analysis: how to obtain optimum results*", imaging material and media research and development, Eastman Kodak Company, Rochester, (2002)
[11] R. A. Lemdiasov, R. Ludwig, "*A stream function method for gradient coil design*", Concepts in Magnetic Resonance Part B 26B(1), (2005)
[12] U.S. Pat. No. 7,069,195
[13] U.S. Pat. No. 7,230,426
[14] H. Sanchez Lopez, M. Poole, S. Crozier, "*Eddy current simulation in thick cylinders of finite length induced by coils of arbitrary geometry*", Journal of Magnetic Resonance 207, (2010)
[15] J. Jin, "*Electromagnetic analysis and design in magnetic resonance imaging*", CRC Press, (1999)
[16] J. Cavanagh, W. J. Fairbrother, A. G. Palmer, III, M. Rance, N. J. Skelton, "*Protein NMR spectroscopy—principles and practice*", Elsevier, Second Edition, (2007)

We claim:

1. An actively shielded gradient coil system for use in a magnetic resonance device, the gradient coil system generating a main magnetic field oriented in a direction of a z-axis, wherein, when a current flows, the gradient coil system generates a gradient field in a measuring volume through which the z-axis extends, the gradient coil system comprising:
  a main coil, said main coil occupying a first radial partial area which extends in a radial direction with respect to the z-axis from $r\_min\_1(z)$ to $r\_max\_1(z)$, with $r\_min\_1(z)$ $r\_max\_1(z)$;
  a shielding coil, said shielding coil occupying a second radial partial area which extends in said radial direction with respect to the z-axis from $r\_min\_2(z)$ to $r\_max\_2(z)$, with $r\_max\_1(z) \leq r\_min\_2(z) \leq r\_max\_2(z)$, wherein active conductor elements of said main coil and of said shielding coil which contribute to the gradient field when a current flows, each take up spatial areas in a plane perpendicular to the z-axis and said first and second radial partial areas are occupied by active conductor elements in more than half of an azimuthal angle range with respect to the z-axis; and
  at least one correction coil, wherein active conductor elements of said correction coil lie outside of said first and said second radial partial areas in each plane perpendicular to the z-axis, said at least one correction coil being electrically connected in series with said main coil and with said shielding coil, active conductor elements of all correction coils together occupying maximally one quarter of an azimuthal angle range with respect to the z-axis, wherein, in comparison to a gradient coil system without correction coil, said at least one correction coil reduces a time duration of eddy currents, which are induced in a vicinity of the gradient coil system due to rapid changes in the current flowing in the gradient coil system.

2. The gradient coil system of claim 1, further comprising additional correction coils, wherein active conductor elements of all correction coils together occupy maximally one quarter of said azimuthal angle range with respect to the z-axis.

3. The gradient coil system of claim 1, wherein a coil cross-section of said at least one correction coil is smaller than a coil cross-section of said main coil.

4. The gradient coil system of claim 1, wherein said at least one correction coil comprises individual serially connected windings at different z positions.

5. The gradient coil system of claim 1, wherein said at least one correction coil comprises individual serially connected windings at different angle positions.

6. The gradient coil system of claim 1, wherein individual windings of said at least one correction coil have different winding directions.

7. The gradient coil system of claim 1, wherein said at least one correction coil is mounted to a coil carrier, said coil carrier having a cross-section perpendicular to the z direction which is round, elliptical or rectangular.

8. The gradient coil system of claim 1, wherein said at least one correction coil is arranged in a space between said main field coil and said shielding coil.

9. The gradient coil system of claim 1, wherein correction of a residual field having a component with m=1 is effected by connecting two correction coils at opposite angle positions which have opposite winding directions.

10. The gradient coil system of claim 9, wherein said opposite angle positions oppose each other by 180 degrees.

11. The gradient coil system of claim 1, wherein correction of a residual field having a component with m=0 is effected, thereby simultaneously suppressing generation of a residual field having a component with m=1 by connecting two correction coils at opposite angle positions which have a same winding direction.

12. The gradient coil system of claim 11, wherein said opposite angle positions oppose each other by 180 degrees.

13. The gradient coil system of claim 1, wherein the gradient coils are mounted to coil carriers which leave open a free space for receiving said at least one correction coil such that said at least one correction coil can be installed in the gradient coil system after assembly of the gradient coils without changing a mutual orientation of the gradient coils.

14. An arrangement of three electrically independent gradient coil systems of claim 1, wherein said three gradient coil systems generate field gradients when a current flows, gradient directions of which being pair wise perpendicular to each other (="XYZ gradient").

15. An MRI arrangement with a main field magnet, an RF transmitting and receiving system and the gradient coil system of claim 1.

16. A probe head for NMR spectroscopy with an RF transmitting and receiving system and the gradient coil system of claim 1.

17. A method for producing the actively shielded gradient coil system of claim 1, the method comprising the steps of:
  a) determining a coil arrangement for the gradient coils;
  b) calculating an induced voltage which is generated during switching of a current through the coil arrangement at a fixed radius which is larger than a largest radius of the gradient coil system at different positions along an axis of the gradient coil system;
  c) configuring a preliminary gradient coil system consisting of at least two gradient coils;

d) measuring the induced voltage at points for which the induced voltage was calculated;
e) determining a difference between the calculated induced voltage and the measured induced voltage;
f) determining positions, winding numbers and winding directions for at least one correction coil such that the calculated difference between the induced voltages plus the induced voltages of the at least one correction coil has as many zero passages as possible;
g) producing the at least one correction coil and installing that coil in the gradient coil system; and
h) monitoring an improvement caused by the at least one correction coil based on the induced voltage and repeating steps e)-g) until a deviation between the voltages measured in step d) and the voltages calculated in step b) is as small as desired.

* * * * *